US006888229B2

(12) United States Patent
DiStefano et al.

(10) Patent No.: US 6,888,229 B2
(45) Date of Patent: May 3, 2005

(54) CONNECTION COMPONENTS WITH FRANGIBLE LEADS AND BUS

(75) Inventors: Thomas H. DiStefano, Monte Sereno, CA (US); Gary W. Grube, Washingtonville, NY (US); Igor Y. Khandros, Peekskill, NY (US); Gaetan Mathieu, Carmel, NY (US); Jason Sweis, Sunnyvale, CA (US); Laurie Union, Santa Clara, CA (US); David Gibson, Palo Alto, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 10/872,105

(22) Filed: Jun. 18, 2004

(65) Prior Publication Data

US 2004/0238922 A1 Dec. 2, 2004

Related U.S. Application Data

(63) Continuation of application No. 09/534,939, filed on Mar. 24, 2000, now abandoned, which is a continuation of application No. 09/268,289, filed on Mar. 15, 1999, now Pat. No. 6,054,756, which is a division of application No. 08/374,559, filed as application No. PCT/US93/06930 on Jul. 23, 1993, now Pat. No. 5,915,752, and a continuation-in-part of application No. 07/919,772, filed on Jul. 24, 1992, now abandoned.

(51) Int. Cl.[7] ............................................. H01L 23/495
(52) U.S. Cl. ................. 257/666; 257/667; 257/668; 257/669; 257/670; 257/671; 257/674; 257/676
(58) Field of Search ................................ 257/666–671, 257/674, 676

(56) References Cited

U.S. PATENT DOCUMENTS 2,758,797 A 8/1956 Miklau 3,374,537 A 3/1968 Doelp, Jr.

(Continued)

FOREIGN PATENT DOCUMENTS

EP 0506112 9/1996
JP 4142050 5/1992

(Continued)

OTHER PUBLICATIONS

"Recent Advances in Single Point TAB Bonding Tools," By Jerry Carlson, Microminiature Technology, Inc., Oct. 23, 1990.

*Primary Examiner*—David E. Graybill
(74) *Attorney, Agent, or Firm*—Lerner, David, Littenberg, Krumholz & Mentlik, LLP

(57) ABSTRACT

A semiconductor chip mounting component includes a support structure adapted to engage a semiconductor chip. The support structure has a top surface, a bottom surface, and a gap extending through the support structure for defining first and second portions of the support structure on opposite sides of the gap. The support structure includes at least one elongated bus disposed alongside the gap, on the second portion of the support structure. The support structure includes a plurality of electrically conductive leads, each lead having a connection section extending across the gap, the connection section having a first end disposed on the first portion of the support structure, and a second end secured to the bus. Each lead includes a frangible section disposed between the first and second ends of the connection section, the frangible section having a cross-sectional area that is smaller than a cross-sectional area of the connection section. The gap is open at the bottom surface of the support structure. A semiconductor chip is disposed beneath the bottom surface of the support structure. The leads are adapted to be bonded to contacts on the semiconductor chip by breaking the frangible sections of the leads so as to disconnect the second ends of the leads from the bus and engage the leads with the contacts of the semiconductor chip.

26 Claims, 14 Drawing Sheets

U.S. PATENT DOCUMENTS

| | | |
|---|---|---|
| 3,460,105 A | 8/1969 | Birt et al. |
| 3,517,438 A | 6/1970 | Johnson et al. |
| 3,684,818 A | 8/1972 | Netherwood |
| 3,822,465 A | 7/1974 | Frankort et al. |
| 4,030,657 A | 6/1977 | Scheffer |
| 4,069,961 A | 1/1978 | Nicklaus et al. |
| 4,141,712 A | 2/1979 | Rogers |
| 4,234,666 A | 11/1980 | Gursky |
| 4,312,926 A | 1/1982 | Burns |
| 4,320,572 A | 3/1982 | Bower et al. |
| 4,331,740 A | 5/1982 | Burns |
| 4,380,042 A | 4/1983 | Angelucci, Sr. et al. |
| 4,413,404 A | 11/1983 | Burns |
| 4,435,741 A | 3/1984 | Shimizu et al. |
| 4,616,412 A | 10/1986 | Schroeder |
| 4,633,583 A | 1/1987 | Kato |
| 4,756,080 A | 7/1988 | Thorp, Jr. et al. |
| 4,776,509 A | 10/1988 | Pitts et al. |
| 4,801,999 A | 1/1989 | Hayward et al. |
| 4,812,421 A | 3/1989 | Jung et al. |
| 4,859,806 A | 8/1989 | Smith |
| 4,887,758 A | 12/1989 | Suzuki et al. |
| 4,989,069 A | 1/1991 | Hawkins |
| 5,007,576 A | 4/1991 | Congleton et al. |
| 5,057,461 A | 10/1991 | Fritz |
| 5,059,559 A | 10/1991 | Takahashi et al. |
| 5,065,504 A | 11/1991 | Olla |
| 5,065,506 A | 11/1991 | Kiribayashi |
| 5,127,570 A | 7/1992 | Steitz et al. |
| 5,148,265 A | 9/1992 | Khandros et al. |
| 5,148,266 A | 9/1992 | Khandros et al. |
| 5,148,967 A | 9/1992 | Gabaldon et al. |
| 5,156,318 A | 10/1992 | Suzuki et al. |
| 5,173,574 A | 12/1992 | Kraus |
| 5,177,863 A | 1/1993 | Lam |
| 5,189,363 A | 2/1993 | Bregman et al. |
| 5,193,732 A | 3/1993 | Interrante et al. |
| 5,217,154 A | 6/1993 | Elwood et al. |
| 5,225,633 A | 7/1993 | Wigginton |
| 5,252,784 A | 10/1993 | Asai et al. |
| 5,390,844 A | 2/1995 | Distefano et al. |
| 5,398,863 A | 3/1995 | Grube et al. |
| 5,459,634 A | 10/1995 | Nelson et al. |
| 5,477,611 A | 12/1995 | Sweis et al. |
| 5,489,749 A | 2/1996 | DiStefano et al. |
| 5,491,302 A | 2/1996 | Distefano et al. |
| 5,536,909 A | 7/1996 | DiStefano et al. |
| 5,548,091 A | 8/1996 | DiStefano et al. |
| 5,550,406 A | 8/1996 | McCormick |
| 5,552,631 A | 9/1996 | McCormick |
| 5,619,017 A | 4/1997 | Distefano et al. |
| 5,629,239 A | 5/1997 | DiStefano et al. |
| 5,637,596 A | 6/1997 | McCormick |
| 5,681,777 A | 10/1997 | Lynch et al. |
| 5,706,174 A | 1/1998 | Distefano et al. |
| 5,787,581 A | 8/1998 | DiStefano et al. |

FOREIGN PATENT DOCUMENTS

| | | |
|---|---|---|
| JP | 4155935 | 5/1992 |
| JP | 4162543 | 6/1992 |
| JP | 4245450 | 9/1992 |
| JP | 4287939 | 10/1992 |
| WO | WO 9205582 | 4/1992 |

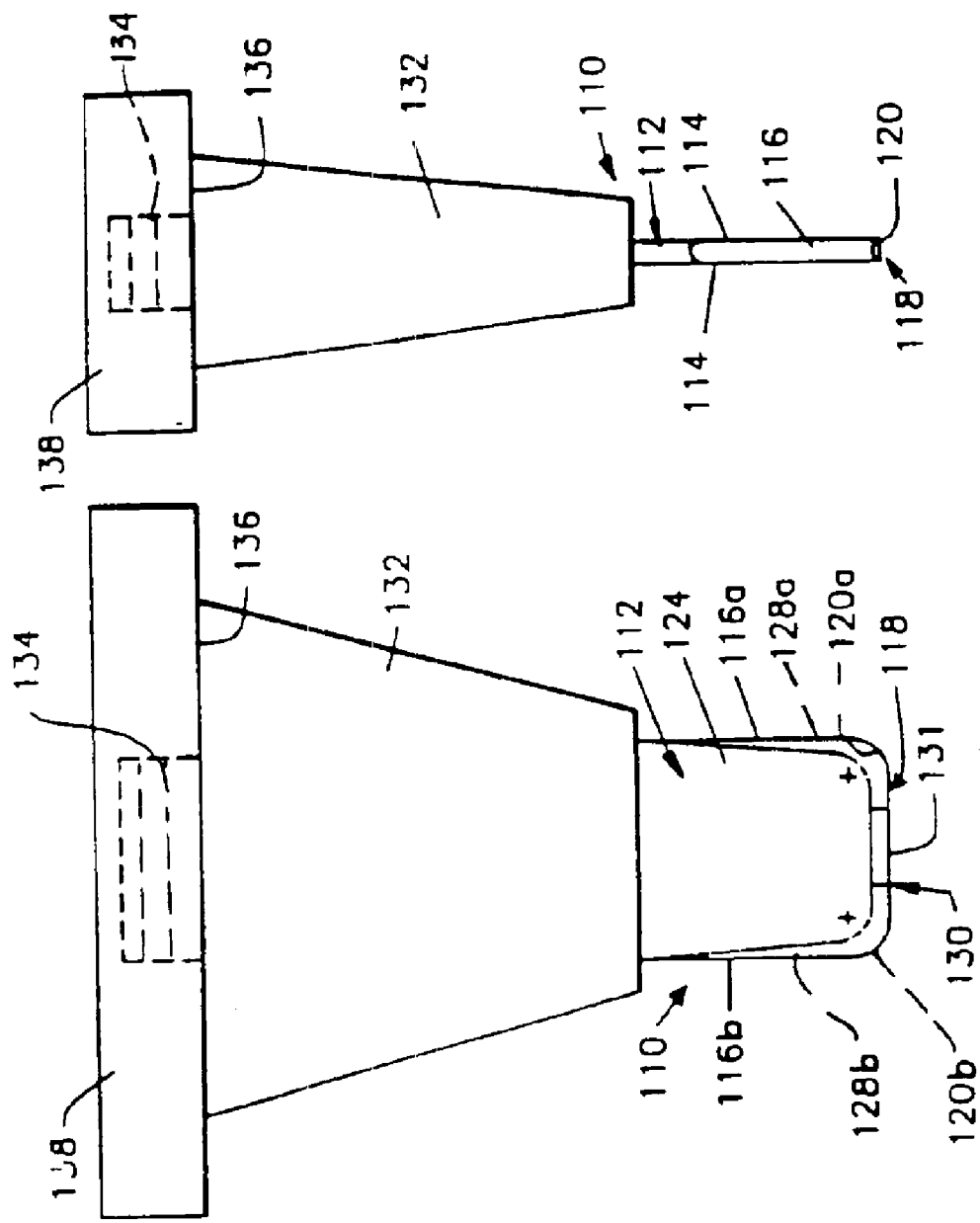

CONNECTION COMPONENTS WITH FRANGIBLE LEADS AND BUS

CROSS-REFERENCE TO RELATED APPLICATIONS

The present application is a continuation of U.S. patent application Ser. No. 09/534,939 filed Mar. 24, 2000, now abandoned which is a continuation of U.S. patent application Ser. No. 09/268,289, filed Mar. 15, 1999, now U.S. Pat. No. 6,054,756, which is a divisional of U.S. patent application Ser. No. 08/374,559, filed May 8, 1995, now U.S. Pat. No. 5,915,752, which is a Section 371 national phase of international application PCT/US93/06930, filed Jul. 23, 1993. Said application Ser. No. 08/374,559 is a continuation-in-part of U.S. patent application Ser. No. 07/919,772, filed Jul. 24, 1992, now abandoned.

BACKGROUND OF THE INVENTION

The present invention relates to methods, components and apparatus useful in mounting and connecting semiconductor devices.

Semiconductor chips typically are connected to external circuitry through contacts on a surface of the chip. The contacts on the chip typically are disposed in the regular patterns such as a grid substantially covering the front surface of the chip, commonly referred to as an "area array" or in elongated rows extending along each edge of the chip front surface. Each contact on the chip must be connected to external circuitry, such as the circuitry of a supporting substrate or circuit panel. Various processes for making these interconnections use prefabricated arrays of leads or discrete wires. For example, in a wirebonding process, the chip is physically mounted on the substrate. A fine wire is fed through a bonding tool. The tool is brought into engagement with the contact on the chip so as to bond the wire to the contact. The tool is then moved to a connection point of the circuit on the substrate, so that a small piece of wire is dispensed and formed into a lead, and connected to the substrate. This process is repeated for every contact on the chip.

In the so-called tape automated bonding or "TAB" process, a dielectric supporting tape, such as a thin foil of polyimide is provided with a hole slightly larger than the chip. An array of metallic leads is provided on one surface of the dielectric film. These leads extend inwardly from around the hole towards the edges of the hole. Each lead has an innermost end projecting inwardly, beyond the edge of the hole. The innermost ends of the leads are arranged side by side at spacing corresponding to the spacings of the contacts on the chip. The dielectric film is juxtaposed with the chip so that the hole is aligned with the chip and so that the innermost ends of the leads will extend over the front or contact bearing surface on the chip. The innermost ends of the leads are then bonded to the contacts of the chip, as by ultrasonic or thermocompression bonding. The outer ends of the leads are connected to external circuitry.

In a so-called "beam lead" process, the chip is provided with individual leads extending from contacts on the front surface of the chip outwardly beyond the edges of the chip. The chip is positioned on a substrate with the outermost ends of the individual leads protruding over contacts on the substrate. The leads are then engaged with the contacts and bonded thereto so as to connect the contacts on the chip with contacts on the substrate.

The rapid evolution of a semiconductor art in recent years has created a continued demand for progressively greater numbers of contacts and leads in a given amount of space. An individual chip may require hundreds or even thousands of contacts, all within the area of the chip front surface. For example, a complex semiconductor chip in current practice may have a row of contacts spaced apart from one another at center-to-center distances of 0.5 mm or less and, in some cases, 0.15 mm or less. These distances are expected to decrease progressively with continued progress in the art of semiconductor fabrication.

With such closely-spaced contacts, the leads connected to the chip contacts, must be extremely fine structures, typically less than 0.1 mm wide. Such fine structures are susceptible to damage and deformation. With closely spaced contacts, even minor deviation of a lead from its normal position will result in misalignment of the leads and contacts. Thus, a given lead may be out of alignment with the proper contact on the chip or substrate, or else it may be erroneously aligned with an adjacent contact. Either condition will yield a defective chip assembly. Errors of this nature materially reduce the yield of good devices and introduce defects into the product stream. These problems are particularly acute with those chips having relatively fine contact spacings and small distances between adjacent contacts.

It has been proposed to form a prefabricated lead assembly having inwardly projecting leads with all of the inner ends of the leads connected to a common inner element. The common element typically is a metallic ring-like structure. In these structures, the inner end of each lead is connected to the common element via a frangible section. The common element thus restrains the inner ends of the leads against relative movement and hence inhibits bending or other deformation of the leads. After the leads have been bonded to the chip contact, the common element is broken away from the leads. A frangible section may be provided at the juncture between the innermost end of each lead and the inner element. Systems of this nature are illustrated, for example, in Thorpe, Jr. U.S. Pat. No. 4,756,080 and in Angelucci, Sr. et al, U.S. Pat. No. 4,380,042. Burns, U.S. Pat. Nos. 4,312,926 and 4,413,404 depict a generally similar arrangement in which the leads are multilayer metallic structures including a copper base with an overcoat of nickel. The frangible connection between the innermost end of each lead and the inner element consists solely of the nickel overcoat layer, thereby providing a very thin, weak section.

In these arrangements, the common element electrically interconnects all of the leads. These interconnections must be eliminated after the leads have been bonded to the chip. Thus, the common element must be pulled away from the chip after the leads have been bonded to the contacts of the chip. All of the frangible elements must be broken either simultaneously or in a particular pattern as the common element is pulled away from the innermost ends of the leads. The need to remove the common element constitutes a significant drawback, inasmuch as this must be done without disturbing the delicate bonds between the lead ends and the contacts on the chip. Perhaps for these reasons, systems utilizing a common element have not been widely adopted.

Thus, despite the substantial time and effort devoted heretofore to the problems associated with mounting and connecting of semiconductors, there have still been substantial, unmet needs for improvements in such processes and in the equipment and components used to practice the same.

One aspect of the present invention provides a semiconductor chip mounting component. A component according to this aspect of the invention includes a support structure having upper and lower surfaces and having a gap extending through the support structure, so that the gap extends downwardly from the upper surface to the lower surface. The component also includes plural electrically conductive leads. Each lead has a connection section extending across the gap in the support structure. First and second ends of the connection section are secured to the support structure on opposite sides of the gap. The second end of each connection section is secured to the support structure so that the second end can be displaced downwardly relative to the support structure responsive to a downward force applied to the connection section. Each connection section is flexible, so that the connection section can be bent downwardly when the second end of the connection section is displaced downwardly relative to the support structure. Thus, the connection section of each lead will be supported at both ends by the support structure during positioning of the component on a semiconductor chip assembly. However, each connection section can be bent downwardly to engage a contact on a part of the semi-conductor chip assembly after the component has been positioned on the part.

Most preferably, the connection sections of the leads are connected to the support structure so that the first end of each such connection section is permanently connected to the support structure, whereas the second end of each such connection section is detachable from the support structure upon application of a downward force to the connection section. The first end of each connection section typically is connected, by a further portion of the lead, to a terminal mounted on the support structure.

In a typical arrangement, the component is adapted to be positioned on the chip itself. Thus, when the component is positioned on the chip, the connection sections of the leads will overlie contacts on the chip. The connection sections are bonded to the contacts on the chip. The leads may have terminals remote from the connection sections for connecting the leads, and hence the contacts of the chip, to contacts on a substrate. In the reverse arrangement, the component according to this aspect of the invention may be adapted for positioning on the substrate, with the connection sections of the leads overlying the substrate so that the connection sections can be bonded to the contacts of the substrate. The leads may be connected to the contacts on the chip through terminals remote from the connection sections.

Each lead may include a second end securement section attached to the support structure and a frangible section connecting the second end of the connection section with the second end securement section, so that the second ends of the connection sections are attached to the support structure through the frangible sections of the leads. The frangible sections can be broken upon downward displacement of the connection sections. The frangible section of each such lead may have a cross-sectional area smaller than the cross-sectional area of the second end securement section and smaller than the cross-sectional area of the connection section.

Most preferably, the connection section of each lead defines a pair of opposed edges and the frangible section has a pair of notches extending inwardly from such edges to define a neck having width less from the width of the connection section. In another arrangement, each lead includes a relatively thick structural metal layer and a relatively thin first supplemental metal layer. The connection section and the second end securement section of each lead incorporate the structural metal layer, whereas the frangible section of each lead includes the first supplemental metal layer but omits the structural metal layer. In yet another arrangement, the second end of each connection section may be bonded to the support structures so that the bond may be broken upon downward displacement of the connection section, whereas the first end of each such connection section is permanently bonded to the support structure.

Alternatively, the frangible section of each lead may include a polymeric material. In yet another arrangement, each lead may extend only partially across the gap in the support structure, and the component may incorporate a polymeric strip associated with each lead extending co-directionally with the lead entirely across the gap. Each such polymeric strip may be secured to the support structure on both sides of the gap and the connection section of each lead may be bonded to the associated polymeric strip. In this case, the second end of each connection section is secured to the support structure only through the associated polymeric strip, and the lead can be displaced downwardly relative to the support structure with breakage or elongation of the polymeric strip.

According to a further aspect of the invention, the component may include a flexible, continuous polymeric reinforcement in contact with each lead at an edge of the support structure so that the polymeric reinforcement will inhabit stress concentration in the lead at such edge when the lead is bent downwardly to engage a contact. Most preferably, the polymeric reinforcement associated with each lead includes a polymeric strip as discussed above overlying the connection section of the lead. Desirably, the polymeric strips associated with the various leads are integral with a polymeric layer of the support structure.

Most preferably, the support structure is formed from dielectric materials such as polymeric materials, so that the support structure does not electrically interconnect the leads with one another. The support structure may have appreciable thickness, i.e., an appreciable distance between its upper and lower surfaces. The leads may be disposed at an appreciable distance above the lower surface of the support structure. For example, the support structure may include a plurality of layers with a top layer defining the upper surface of the structure and a bottom layer defining the lower surface. The leads may be disposed above the bottom layer. Alternatively, the component may be supported above the chip during the mounting process. In either case, each connection section is supported above the front surface of the chip by the support structure before such connection section is displaced downwardly to engage a contact. The component may include terminals disposed on the support structure. In a particularly preferred arrangement, the terminals, as well as the leads are disposed above a bottom layer and the bottom layer is resilient so as to permit downward displacement of the terminals.

The gap in the support structure may be formed as an elongated slot. The connection sections of many leads may extend across such slot. The connection sections extending across each such slot are disposed in side-by-side, substantially parallel arrangement. In a particularly preferred arrangement, the component further includes an elongated bus extending on the support structure alongside each elongated slot and the releasable or second end of the connection section of each lead extending across the slot is connected to the bus by a frangible element. Preferably, each lead includes a frangible section and the bus, the frangible section and the connection section of each lead are formed integrally with one another. Each lead may also include a second and securement section disposed between the frangible section and the bus.

Typically, the bus, as well as the leads, are formed from one or more metallic materials. The bus serves to reinforce the support structure and leads, and maintain even more accurate positioning of the leads when the component is assembled to a chip. Moreover, during manufacture of the component, the bus can be used to provide electrical conductivity for plating processes as, for example, in formation of terminals.

In a particularly preferred arrangement, the gap in the support structure may include a plurality of elongated slots. The support structure may have a central portion and a peripheral portion, and the slots may extend substantially around the central portion so that the slots are disposed between the central portion and the peripheral portion. A bus as aforesaid may be provided alongside each slot, desirably on the peripheral portion, so that one such bus extends alongside each slot. Preferably, the slots are connected to one another to form a substantially continuous channel surrounding the central portion, leaving the central portion of the support structure connected to the peripheral portion only through the leads. All of the buses may be connected to one another so that the buses cooperatively form a hoop-like structure on the peripheral portion, substantially surrounding the slots and the central portion. In such an arrangement, the first or permanently connected end of the connection section of each lead faces towards the central portion of the support structure and is electrically connected to a terminal on the central portion. During the connection process, the frangible sections of the leads are broken so that the leads are detached from the peripheral portion, thereby detaching the central portion from the peripheral portion and leaving the peripheral portion connected to the chip. At the same time, the leads are electrically disconnected from the buses.

In an alternative arrangement, some of the leads associated with each slot may have their first or permanently mounted ends disposed at a first edge of the slot and their second or releasably connected ends disposed a second edge of the slot, whereas the remaining leads associated with the same slot may have the reverse arrangement, i.e., the first end of the lead disposed at the second edge of the slot and the second end of the lead connection section disposed at the first edge of the slot. According to a further alternative, the gaps in the support structure may be relatively small holes extending through the support structure. One lead, or a few leads, may extend across each such hole. There may be numerous holes disposed at various locations on the support structure. For example, the holes, and the leads, may be disposed in an array substantially covering the top and bottom surfaces of the support structure as, for example, where the component is to be used with a chip or other element having contacts in a "area array" on substantially the entirety of its front surface.

A further aspect of the invention provides methods of making connections to contacts on a part of a semiconductor chip assembly, such as to contacts on a front surface of a semiconductor chip or contacts on a chip mounting substrate. Methods according to this aspect of the invention desirably include the steps of juxtaposing a connection component, such as a component described above, with the part so that a bottom surface of the support structure in the component faces downwardly, towards the surface of the part and the top surface of the connection component faces upwardly, away from the front surface of the part. The connection component is juxtaposed with the part so that each contact on the part surface is aligned with a gap in the support structure and so that connection sections of leads extending across the gap are disposed above the contacts. The support structure supports each connection section at both sides of each such gap during the juxtaposing step, so that the connection section does not tend to bend or deform at this stage of the process.

The method desirably further includes the step of bonding each connection section to a contact on the part by displacing each connection section downwardly so as to displace one end of each such connection section downwardly relative to the support structure and bring the connection section into engagement with the contact of the part. Preferably, the bonding step is performed so as to detach one end of each connection section from the support structure during the downward displacement of the connection section as, for example, by breaking a frangible portion of each lead or detaching a bond between the lead and the support structure as discussed above. In a particularly preferred arrangement, the support structure has a gap in the form of one or more elongated slots and buses along the slots serve to reinforce the support structure prior to and during the connection step. As also discussed above, the gap in the support structure may surround a central portion of the support structure so that the central portion is initially attached to the peripheral portion only through the leads, and the connection step may serve to sever the central portion from the peripheral portion.

The bonding step most preferably includes the step of engaging each connection section with a recess in a bonding tool so that the bonding tool at least partially controls the position of the connection section in lateral directions transverse to the downward travel of the bonding tool.

The use of the bonding tool to guide and constrain the lead during the bonding step may be applied even where the connection component does not have the connection sections connected to the support structure at both ends. Thus, the step of guiding the connection section of the lead with the bonding tool may be employed even where the leads are cantilevered from an edge of the support structure. Most preferably, the methods according to this aspect of the invention further include the step of aligning the bonding tool with the contacts on the part, such as with contacts of a semiconductor chip. Preferably, the step of engaging the bonding tool with the leads is performed so that the bonding tool actually brings the leads into alignment with the contacts. That is, the contact sections of the leads may be slightly out of alignment with the contacts, but the bonding tool moves the leads in directions transverse to the leads as the bonding tool is engaged with the leads, thereby bringing each lead into alignment with the contacts. Thus, it is unnecessary to achieve exact alignment between the connection sections of the leads and the contacts on the part when the connection component is first applied to the part. Any slight misalignment will be corrected by action of the bonding tool.

In one arrangement, each connection section is an elongated, strip-like structure and the bonding tool has an elongated groove or recess in its bottom surface. The bonding tool is positioned above each contact so that the groove or recess extends in a pre-selected groove direction and extends across the top of a contact. The connection sections of the leads extend generally parallel to the groove direction, so that when the bonding tool is advanced downwardly to engage the lead, the connection section of each lead is seated in the groove. If the lead is slightly out of alignment with the groove, the lead will be moved in lateral directions, transverse to the groove, until it seats in the groove and thus becomes aligned with the contact.

Yet another aspect of the present invention provides a tool for bonding leads to contacts on a semiconductor chip, substrate or other part of a semiconductor chip assembly. A tool according to this aspect of the invention desirably includes a generally body defining a bottom and a groove extending in a lengthwise direction along such bottom for engaging leads to be bonded. The tool desirably also includes means for connecting the tool to a bonding apparatus so that the bottom of the tool faces downwardly. Such a tool can be used in methods as aforesaid. Most preferably, the groove has a central plane and surfaces sloping upwardly from the sides of the groove towards the central plane. These sloping surfaces will tend to guide a lead engaged with the tool towards the central plane of the groove.

Yet another aspect of the invention provides methods of making semiconductor connection components. Methods according to this aspect of the invention include the steps of providing one or more conductive leads, each lead having an elongated connection section. The method further includes the step of treating a dielectric support structure in contact with the leads so that the support structure incorporates one or more gaps aligned with the connection sections of the leads and so that each lead is permanently secured to the support structure at one end of the connection section and releasably secured to the supporting structure at the other end of the connection section. The leads may be provided on a sheet-like dielectric support layer and may be supported by such layer. The step of forming the support structure may include the step of selectively removing a part of the dielectric layer to form a gap therein in alignment with the connection sections of the leads.

The step of providing the leads may include the step of forming each lead with a fragile section in the connection section. Thus, the leads may be formed by plating an electrically conductive material such as a metal, preferably gold, to form elongated strips of a preselected width with frangible sections of a lesser width. Where the component is to be provided with elongated buses as discussed above, the buses may be formed by plating at the same time as the leads. The dielectric layer may be formed from a polymeric material such as polyimide and the step of selectively removing a portion of the dielectric layer may be performed after forming the strips. That is, the strips are deposited on the dielectric sheet and the dielectric sheet is then etched or otherwise selectively treated so as to form the gap or gaps. After formation of the gap or gaps, one end of each connection section remains connected to the dielectric sheet through the frangible section, and hence is releasably connected to the dielectric sheet. Alternatively, the leads may be formed by providing strips of a conductive structural material so that each such strip has an interruption therein, and depositing a first supplemental material so that such supplemental material overlies each strip at least in a zone of the strip including the interruption, so as to leave portions of the strip on opposite sides of the interruption connected to one another by the first supplemental material. Thus, the frangible section of each lead may include a section formed from the supplemental material. The structural material and the supplemental material may both be metals and the supplemental material may be applied as a thin layer in a plating process before treating the dielectric material to form the gaps.

Alternatively, the leads may be formed by depositing strips of a conductive material, without frangible sections, on the dielectric sheet and then etching the dielectric sheet to form the gap or gaps. The dimensions of the gap or gaps so formed are controlled so as to leave each lead with a relatively large first end securement section bonded to the dielectric sheet on one side of the gap and with a relatively small, second end securement section bonded to the sheet on the other side of the gap, so that the end of each lead adjacent such other section can be detached from the dielectric sheet by breaking this relatively small bond. In this instance, there is no need to form a frangible section in each lead.

The foregoing and other objects, features and advantages of the present invention will be more readily apparent from the detailed description of the preferred embodiments set forth below, taken in conjunction with the accompanying drawings.

BRIEF DESCRIPTION OF THE DRAWINGS

FIG. 6 is a diagrammatic side elevational view of a tool utilized in the assembly process of FIG. 5.

FIG. 7 is a diagrammatic end elevational view of the tool depicted in FIG. 6.

DETAILED DESCRIPTION

Figure 2:
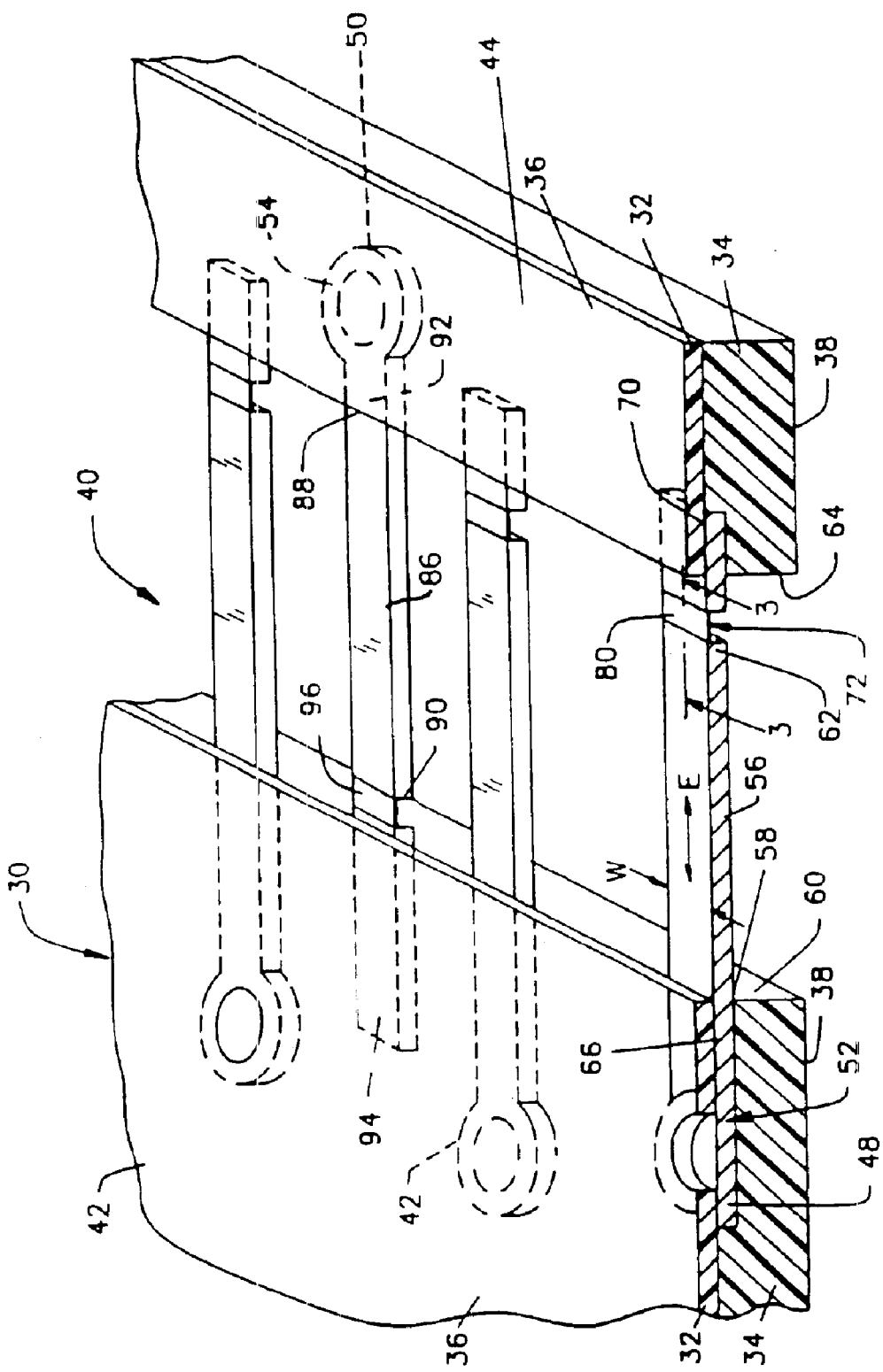
FIG. 2 is a fragmentary, diagrammatic, partially sectional view depicting a portion of the component illustrated in FIG. 1.

A semiconductor connection component in accordance with one embodiment of the invention has a supporting structure 30 incorporating a flexible top dielectric layer 32 and a bottom, compliant dielectric layer 34 (FIG. 2). Body 30 is generally sheet-like and has a top surface 36 defined by top layer 32 and a bottom surface 38 defined by bottom layer 34. The terms "top" and "bottom" are used herein to indicate directions relative to the structure of the connection component itself. It should be understood as referring to the frame of reference of the component itself, and not to the ordinary, gravitational frame of reference. Likewise, the terms "upwardly" and "downwardly" should also be understood as referring to the frame of reference of the component itself. Top layer 30 may be about 0.01 to about 0.1 mm thick, whereas bottom layer 34 may be about 0.05 to about 1.0 mm thick. Support structure 30 may be formed as part of a large, substantially continuous strip-like tape 33 containing a plurality of such support structures.

Figure 1:
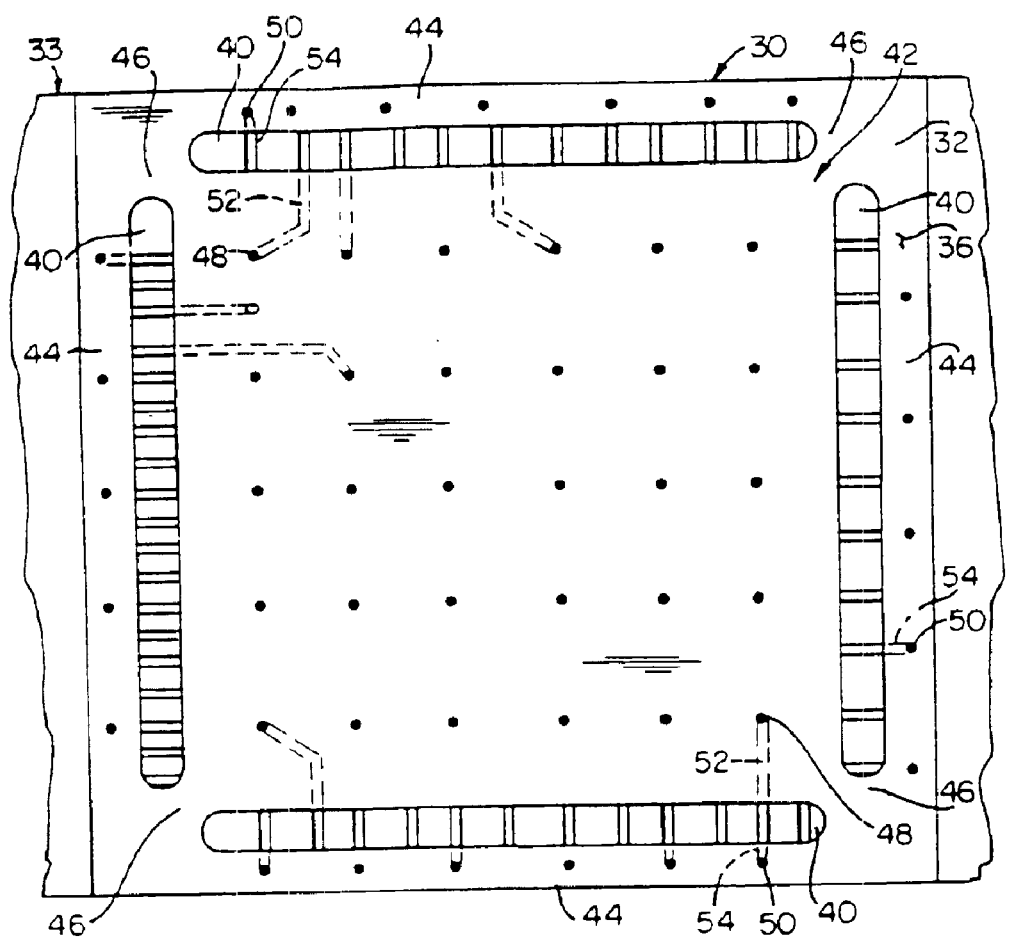
FIG. 1 is a diagrammatic plan view of a semiconductor connection component in accordance with one embodiment of the invention.

Support structure 30 has four gaps 40 in the form of elongated slots extending through the support structure, from the top surface 36 to the bottom surface 38. The gaps or slots 40 subdivide structure 30 into an interior portion 42 substantially bounded by the gaps 40 and four strip-like outer securement elements 44 disposed outside of the gaps, the securement elements 44 being connected to the central portion 42 by bridge elements 46. As best seen in FIG. 1, the gaps or slots 40 define a generally rectangular pattern, with the slots defining the edges of the rectangle and the bridge elements 46 being disposed at the corners of the rectangle.

The component also includes a plurality of central terminals 48 disposed on the central region 42 of the support structure and a plurality of outside terminals 50 disposed on the securement elements 44. For clarity of illustration, the drawings depict only a relatively small number of central terminals 48 and outside terminals 50. In actual practice, however, there may be hundreds or even thousands of terminals. Each central terminal 48 is associated with a central terminal lead 52, whereas each outside terminal 50 is associated with an outside terminal lead 54. As best seen in FIG. 2, each central terminal 48 is disposed between top layer 32 and bottom layer 34 on the central region 42 of the support structure. Each of the terminals 48 is exposed at the top surface of the component, through apertures in the top dielectric layer. The central terminal lead 52 associated with each such central terminal 48 is formed integrally with that central terminal and extends from it towards the periphery of the support structure, outwardly across one of the slots 40. Each central terminal lead thus includes an elongated connection section 56 extending across the associated gap or slot 40. A first end 58 of each such connection 56 lies at the first side 60 of the slot 40, at the central region 42, whereas the second end 62 of each such connection section 56 lies adjacent the second, opposite side 64 of the slot, adjacent the securement element 44. Each central terminal lead 52 also includes a first end securement section 66 extending from the associated terminal 48 to the first end of the connection section. The first end securement section and the connection section of each such lead merge with one another at first edge 60 of gap 40. Each central terminal lead also includes a second end securement section 70 attached to the securement structure 44 on the second side of slot 40. Each central terminal lead 52 also includes a frangible section 72 disposed between the second end 62 of the connection section 56 and second end securement section 70.

Figure 3:
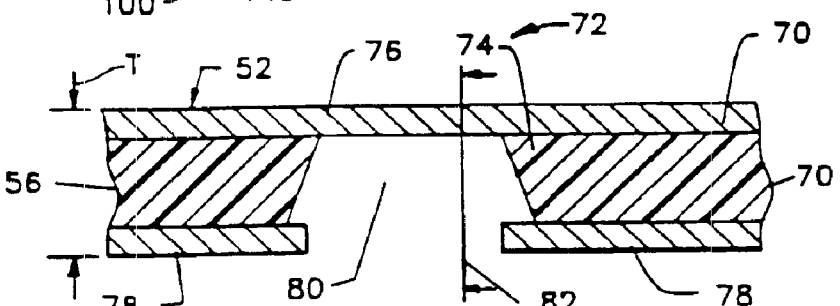
FIG. 3 is a diagrammatic, fragmentary, sectional view on an enlarged scale taken along line 3—3 in FIG. 2.

As best seen in FIG. 3, each central terminal lead includes a structural metal layer 74, a first supplemental metal layer 76 above the structural metal layer 74 and a second supplemental metal layer 78 below the structural metal layer 74. All of these layers are present throughout the entirety of each central terminal lead 52, except that the second supplemental layer 78 and the structural metal layer 74 are interrupted at the frangible section 72. Stated another way, the frangible section 72 consists only of the first supplemental layer 76. Thus, the connection section 56 includes all three metal layers 74, 76 and 78, as does the second end securement section 70, whereas the intervening frangible section 72 includes only the first supplemental layer 76. The supplemental metal layers are substantially thinner than the structural metal layer 56. The frangible section has a groove or notch 80 extending across the lead. As best appreciated with reference to FIG. 2, the groove or notch 80 of each such frangible section 72 is transverse to the direction of elongation E of the connection section 56. Because each such frangible section 72 consists only the first supplemental metal layer 76, the cross-sectional area of the lead in the frangible section 72 is substantially less than the cross-sectional area of the connection section 56 and less than the cross-sectional area of the second end securement section 70. As used in this disclosure, references to the "cross-sectional" areas of the leads should be understood as referring to the cross-sectional area in an imaginary cutting plane, such as cutting plane 82, transverse to the elongation direction of the lead, i.e. the cross-sectional area of the lead portion in question seen when viewing in the elongation direction E (FIG. 2).

Structural metal layer 74 (FIG. 3) desirably is about 0.01 mm to about 0.05 mm thick, whereas each of the supplemental metal layers 76 and 78 desirably is about 1 micron to about 75 microns thick. In each case, the thickness is measured in the vertical direction. The width W of the connection section 56 in the horizontal direction transverse to the thickness of the lead and transverse to the direction of elongation E of the connection section desirably is between 0.025 and about 0.25 mm. The frangible section 72 has substantially the same width but a very small thickness, equal only to the thickness of the first supplemental layer 76.

Typically, the supplemental metal layers are applied as platings or coatings on the structural metal layer 56. Structural metal layer 74 preferably is formed from a metal selected from the group consisting of copper, platinum, gold, nickel, aluminum, silver, alloys of these metals with other metals and combinations of such metals and alloys. Of these, silver generally is less preferred whereas gold is more preferred. The supplemental metal layers may be formed from metals selected from the same group. Gold, nickel and copper are particularly preferred as supplemental metal layers. Typically, the supplemental metal layers are formed from a different metal than the structural metal layer.

The outside terminal leads 54 are identical to the central terminal leads 52 except that the positions of the various elements in the outside terminal leads are reversed. Thus, each outside terminal lead 54 has a connection section 86 extending across one of the slots 40. The first end 88 of each such connection section 86 is disposed adjacent the second edge 64 of slot 40, i.e., adjacent the securement element 44, whereas the second end 90 of each such connection section is disposed adjacent the first edge 60 of the slot and hence adjacent the central region 42 of the securement structure. The first end securement section 92 of each outside lead 54 is mounted to the securement element 44, whereas the second end securement section 94 of each such lead is mounted to the central region 42 of the support structure. Each outside terminal lead is provided with a frangible section 96 disposed between its second end securement section 94 and the second end 90 of its connection section 86. The widths and thicknesses of the various elements in each outside lead are identical to those of the central terminal leads discussed above.

The connection sections 56 and 86 of the various leads extend across each slot 40 in a generally side-by-side array. Thus, the elongated connecting portions of the various leads associated with each gap or slot 40 extends substantially parallel to one another. The elongation directions of all of these connecting portions associated with each slot are substantially transverse to the direction of elongation of the slot itself. The spacings between adjacent connection sections are selected so that the center-to-center distances between connection sections are equal to the center-to-center distances between contacts on the chip to be connected. Thus, the center-to-center distances between adjacent connection sections 56 and 86 in a given slot 40, measured in the lengthwise direction of the slot, transversely to the directions of elongation of the connection sections may be about 0.5 mm or less and may preferably be about 0.25 mm or less. Also, the dimensions of support structure 30, including the distances between slots 40 are likewise selected to match the distances between contact rows on the chip.

Figure 4:
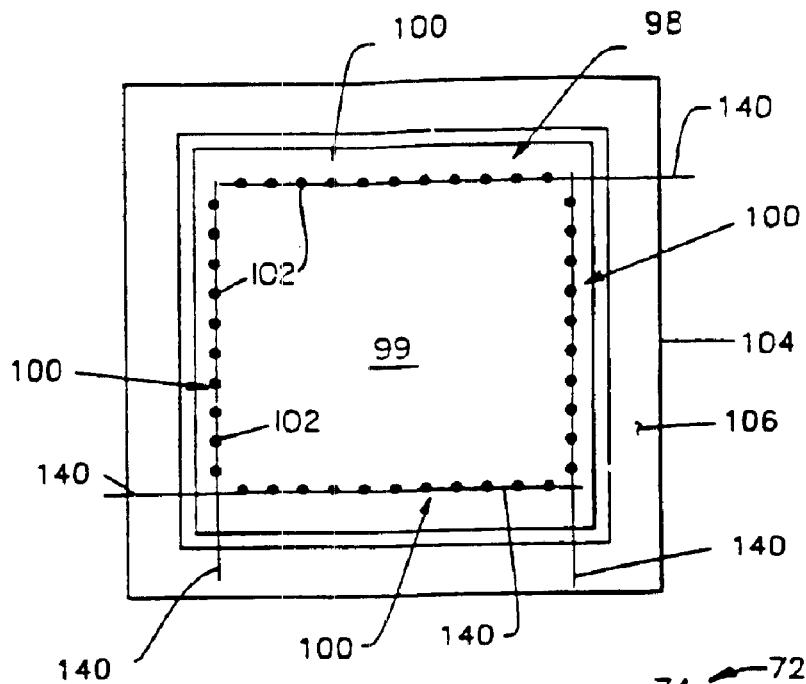
FIG. 4 is a diagrammatic plan view of a chip and another element used with the component of FIGS. 1–3.

The connection component discussed above with reference to FIGS. 1–3 may be utilized in conjunction with a semiconductor chip 98 seen in FIG. 4. Chip 98 may be a conventional semiconductor chip generally in the form of a rectangular solid having a generally planar front surface 99 with four rows 100 of electrical contacts 102 disposed on such front surface adjacent the edges thereof. The contacts in each such row are disposed along the longitudinal axis 140 of the row. As further discussed below, a generally rectangular collar or supporting ring 104, having a generally planar front or top surface 106 may be employed in conjunction with chip 98. Ring 104 is dimensioned so as to closely surround chip 98. Also, ring 104 has the same thickness as chip 98, so that the top surface 106 of the ring will lie substantially flush with the front surface 99 of the chip when the ring and the chip are disposed on a flat supporting structure.

Figure 5:
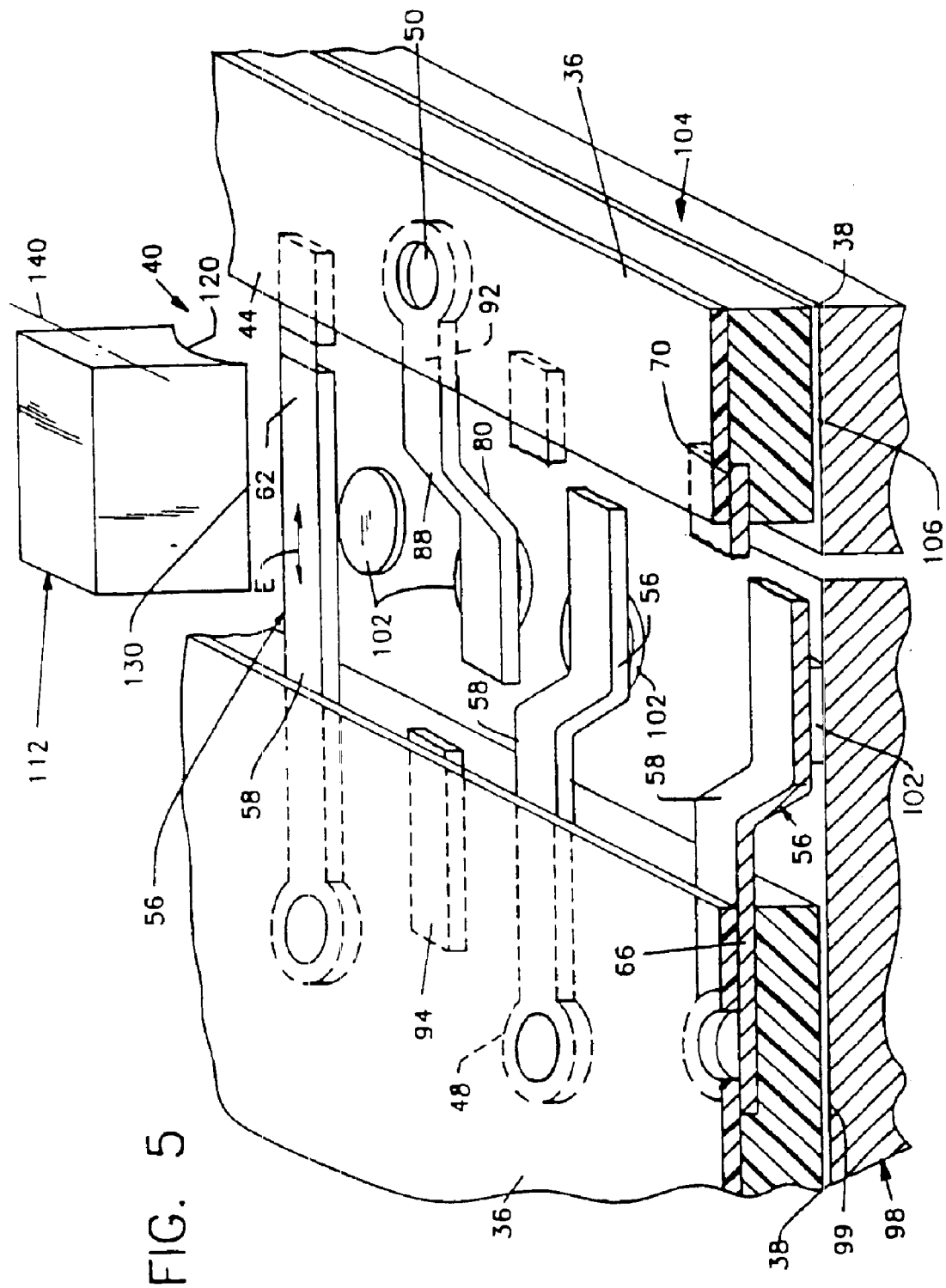
FIG. 5 is a view similar to FIG. 2 but depicting the component of FIG. 2 in conjunction with the components of FIG. 4 during an assembly process.

In one assembly process according to an embodiment of the invention, chip 98 and ring 104 are disposed on a flat surface (not shown) in the orientation illustrated in FIG. 4. The connection component is disposed atop the chip and ring as shown in FIG. 5, with the bottom surface 38 of the connection component support structure facing downwardly and abutting the top surfaces 99 and 106 of the chip and ring and with the top surface 36 of the connection component support structure facing upwardly, away from the chip. The slots or gaps 40 in the connection component support structure are substantially aligned with the rows of contacts 102 on the chip, one such aligned slot 40 and contact row 100 being illustrated in FIG. 5. Thus, the lengthwise direction of each slot extends generally parallel to the lengthwise axis 140 of the aligned row of contacts, whereas each of the connection sections 56 and 86 extending across such slot extend transverse to such lengthwise axis.

The connection component may be placed on the chip using conventional automatic pattern recognition systems and automatic positioning elements to assure the desired placement of the connection component relative to the chip. Thus, the pattern recognition equipment is linked to a feedback system for controlling either the position of the chip or the position of the connection component so as to align the slots or gaps 40 with the rows of contacts on the chip, and to bring the connection sections of the individual leads into alignment with the correct contacts 102 themselves. Automatic positioning equipment and methods per se are well-known and hence need not be described further herein. Despite such automatic positioning equipment and methods however, there will still be some misalignment between the connection sections and the contacts. For example, tolerances on the size and shape of the connection component may result in some individual leads being slightly misaligned with the associated contacts on the chip even when other leads are perfectly aligned. It is difficult to achieve perfect alignment of the connection sections of all the leads and all of the contacts on the chip by adjusting the relative positions of the entire connection component and chip. Preferably, however, any misalignment of an individual lead connection section and the associated contact in the lateral or width-wise directions of the connection section amounts to less than about one-half the center-to-center distance between adjacent connection sections, i.e., less than about one-half of the spacing between adjacent contacts on the chip. Thus, the connection sections of the individual leads at this stage of the process are crudely aligned with the contacts in the lateral directions. Positioning of the connection sections relative to the contacts on the chip in the elongation directions is considerably less critical. Because the connection sections are elongated, each elongation section may be displaced from its nominal position relative to the associated contact on the chip by a considerable amount, up to about one-half the length of the connection section, while still leaving a portion of the connection section in an appropriate position for engagement with the chip contact in subsequent stages of the process.

Figure 8:
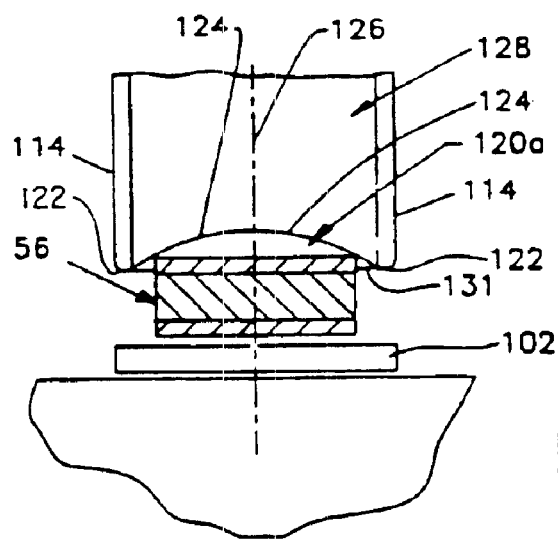
FIG. 8 is a fragmentary, sectional view on an enlarged scale depicting portions of the tool of FIG. 6 and the components of FIGS. 1–5 during the assembly process.

In the next stage of the process, a bonding tool 110 is employed. As best seen in FIGS. 6, 7 and 8, bonding tool 110 has a generally flat, blade-like body 112 with a pair of opposed side surfaces 114 (FIG. 7) a pair of vertical edges 116 (FIG. 6) and a lower edge 118 extending between vertical edges 116. The tool has an elongated first groove 120a formed in lower edge 118 and extending inwardly along such lower edge from one vertical edges 116a to a coupling portion 130 adjacent the midpoint of lower edge 118. Groove 120 occupies substantially the entire width of lower edge 118. As best seen in FIG. 8, groove 120 has opposed sides 122 adjacent the opposite faces 114 of body 112, and has surfaces 124 sloping upwardly from sides 122 to the central plane 126 of the groove, midway between sides 122. Groove 120 merges with a vertical groove 128a extending upwardly along the adjacent edge 116a of the body. Groove 128 tapers in depth so that the depth of this groove gradually decreases towards the upper end thereof. The tool has a radius at the corner between lower edge 118 and vertical edge 116a. The grooves 120a and 128a extend around these radii and merge with one another at such radii.

The tool also has a generally flat coupling portion 130 extending transversely across lower edge 118, from one of the faces 114 to the other, midway between vertical edges 116. Coupling portion 130 defines a bottom surface 131 (FIG. 8) approximately flush with the edges 122 of groove 120a. The bottom surface 131 has small ridges, grooves or other roughening features (not shown). The bottom edge of the tool is also provided with a second groove 120b extending lengthwise along the bottom edge 118 from coupling portion 130 to vertical edge 116b, opposite from edge 116a. Groove 120b and edge 116b are similar to groove 120a and edge 116a discussed above. Thus, a vertical groove 128b on edge 116b joins groove 120b. Tool 110 also has a shank 132 extending upwardly from the top of blade-like body 112, the shank having a screw tip 134 and shoulder 136 at its upper end, remote from body 112. These features are adapted to mate with the tool holder 138 of a bonding apparatus so that the tool may be held in an operative position on the apparatus and so that force and energy from the apparatus may be directed downwardly through the tool as discussed below. The screw tip 134 and shoulder 136 are merely illustrative. The exact configuration of the features which hold the tool to the apparatus will vary with the nature of the apparatus employed. Any such features and/or shapes which will allow the tool to meet with the particular bonding apparatus can be employed. Further illustrations of such features include bolt holes in the tool for mating with bolts on the apparatus, bayonet locks, taper locks and/or straight shanks for engagement in a chock or collet.

In the bonding step of the assembly process, the assemblage of the chip 98, ring 104 and the connection component is aligned with the body 112 of tool 110 so that the elongated groove 120 is aligned with a contact 102 on the chip. Such alignment can be achieved by moving the chip and other associated components relative to the bonding apparatus under control of an automatic vision system or other system for monitoring the position of the chip. The tool is oriented so that groove 120 extends substantially transverse to the direction of the row of contacts, i.e., substantially transverse to the lengthwise axis 140 of the contact row (FIG. 5). The groove 120 thus is roughly aligned with the elongation directions E of the connection sections 56 and 86 of the connection component leads overlying that particular row of contacts. However, it should be understood that, in this embodiment, the alignment is established between the tool and the chip, and not between the tool and any element of the connection component. Thus, to the extent that the connection section of a particular lead is out of alignment with the associated contact on the chip, in a lateral direction transverse to the direction of elongation of such lead, such lead connection section will be out of alignment with the tool as well. Provided that the connection sections of the leads have been crudely aligned with the contacts as discussed above, however, any minor remaining misalignment will be corrected by the tool itself during the next step.

Once the tool and the contact of the chip are in alignment, the tool is advanced downwardly, in the direction indicated by arrow 142 in FIG. 5, so as to force the connection section of the most closely aligned lead downwardly. As best appreciated with reference to FIG. 8, as the inwardly sloping surfaces 124 of grooves 120a and 120b engage the connection section 56 of a lead, they displace the lead laterally, towards the central plane 126 of the groove and hence into precise lateral alignment with the contact 102. As the tool moves downwardly under the influence of forces applied by the bonding apparatus, it displaces the connection section 56 downwardly relative to the support structure 30 of the connection component. As the second end 62 of the connection section 56 is forced downwardly, frangible section 72 breaks, thereby freeing the second end from the securement element and detaching the same from the support structure. The first end 58 of each such connection section bends downwardly so that the freed connection section can be forced into engagement with the aligned contact 102 by the tool. At the time the second end 62 of each connection section 56 is detached from the support structure, it is already engaged with the groove 120 of the tool. At this time, the support provided to the second end of the connection section to prevent lateral displacement is no longer necessary or desirable. As the tool forces the connection section into engagement with the contact 102, heat and/or ultrasonic vibrations may be applied by the bonding apparatus through the tool so as to cause the connection section to bond to the contact. The lower surface 131 of coupling section 130 bears on the connection section of each lead to force it against the contact. Applied vibrations may be directed along the lengthwise dimension of groove 120, and hence generally along the direction of elongation of the connection section. The roughened surface of coupling section 130 aids in coupling the tool to the connection sections of the lead for transmission of vibrations therebetween. In a further embodiment, the coupling section 130 may be arranged to protrude downwardly beyond the adjacent sections of the tool lower edge 118.

After the connection section of one lead has been bonded to a contact, the tool is retracted upwardly and advanced along the direction of the axis 140 of the contact row. The tool is then aligned with the next contact, and the process is repeated. On some repetitions of the bonding operation, the tool will engage the connection sections 86 of the outside terminal leads 84. The tool is operated in the same manner to bond the outside terminal leads. However, the frangible section which breaks is on the opposite side of the slot 40.

Once this bonding process has been performed for all of the leads, the contacts 102 are connected to the central terminals 48 and outside terminals 50 of the securement element. The subassembly is then ready for testing and further use. As discussed in greater detail in co-pending, commonly assigned U.S. patent application Ser. Nos. 07/586,758, filed Sep. 24, 1990 and 07/673,020 filed Mar. 21, 1991, and in published International Application W092/05582, (Application No. PCT/US91/06920), the disclosures of which are hereby incorporated by reference herein, the compliant bottom dielectric layer 34 permits displacement of the terminals 48 and 50 in the vertical direction towards the front surface 99 of the chip and towards the top surface 106 of the ring. This facilitates engagement of a multiplicity of the terminals with a multiplicity of test probes simultaneously. Compliant layer 34 may have the structure shown in said earlier applications. As more fully described therein, the compliant layer may incorporate holes and masses of compliant material, the masses being aligned with the terminals. As described in said co-pending applications, subassemblies incorporating a connection component (also referred to as a "interposer") may be mounted to a substrate such as a circuit panel or semiconductor package. The terminals 48 and 50 of the connection component are connected to contact pads on the substrate. As described in detail in said co-pending applications, the terminals 48 and 50 on the connection component can move relative to the contacts 102 of the chip, typically in directions parallel to the front surface 99 of the chip. This provides compensation for differential expansion and contraction of the chip and substrate.

Figure 9:
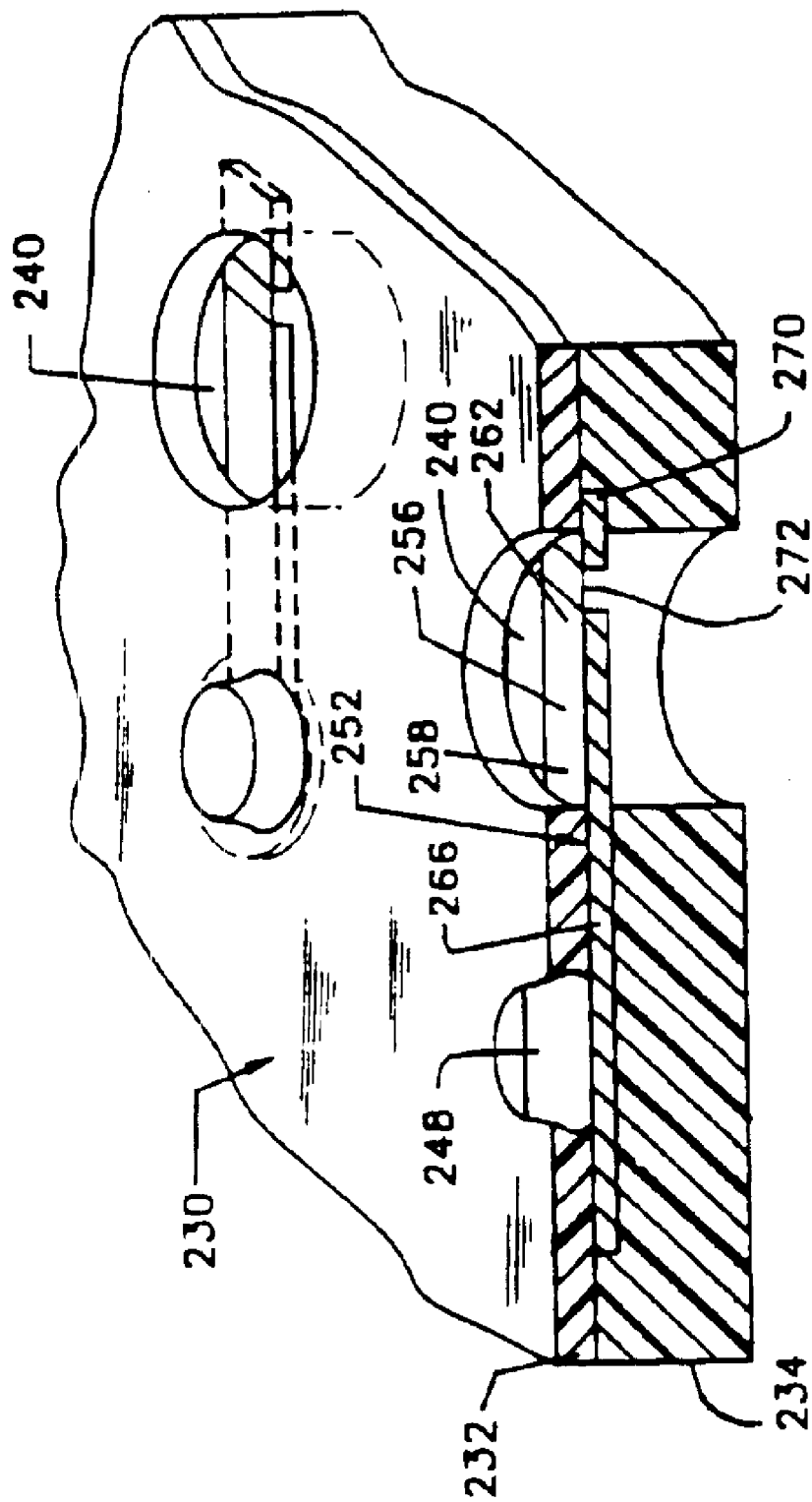
FIG. 9 is a view similar to FIG. 2 but depicting portions of a component in accordance with a further embodiment of the invention.

The connection component shown in FIG. 9 is similar to the component described above. It incorporates a support structure 230 having a flexible top layer 232 and a compliant dielectric bottom layer 234. However, the gaps 240 in the support structure are not formed as elongated slots, but, instead, are formed as individual holes. These holes 240 are substantially equally distributed over the entire surface area of the support structure 240. Each lead 252 is associated with one such hole, and each lead has a connection section 256 extending across such hole. Each such connection section has a first end 258 adjacent one side of the hole, and a second end 262 adjacent the other side of the hole. Once again, the first end 258 of the connection section is connected by a first end securement section 266 to a terminal 248, whereas the second end 262 of the connection section is connected to a thin, frangible section 272, which, in turn, is connected to a second end securement section 270 attached to the support structure. Thus, the second end 262 of the connection section is attached to the support structure through the frangible section 272. The terminals 248 on the structure of FIG. 9 protrude above the top layer 232. Essentially any terminal configuration can be employed, provided that the terminals are in electrical contact with the leads.

Components according to this embodiment of the invention can be used in essentially the same way as the components discussed above. These components are employed with chips having contacts disposed in a "area array" of contacts distributed over substantially the entire area of the chip front surface. The connection component is disposed on the chip front surface so that each contact on the chip is aligned with one hole and crudely aligned with the connection section 256 of one lead. A bonding tool as discussed above is advanced into each hole so as to engage the connection section of the associated lead. Once again, the bonding tool is aligned with the contacts on the chip. Engagement of the bonding tool with the connection section serves to bring the connection section into precise alignment with the contact.

Figure 10:
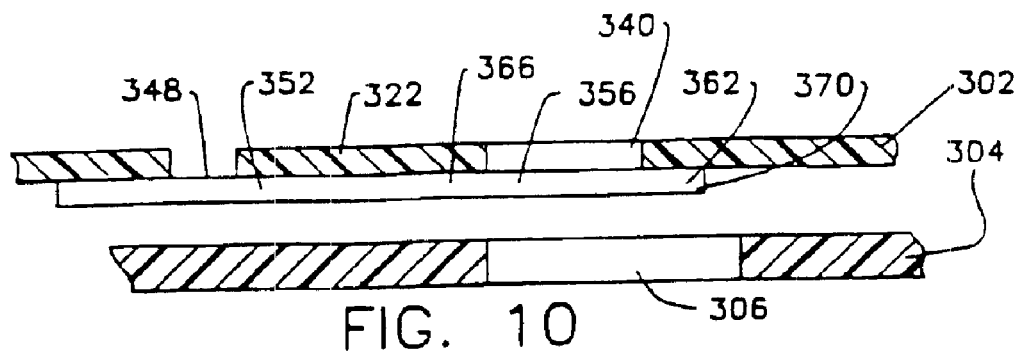
FIG. 10 is a fragmentary, sectional view depicting portions of a component in accordance with yet another embodiment of the invention.
Figure 12:
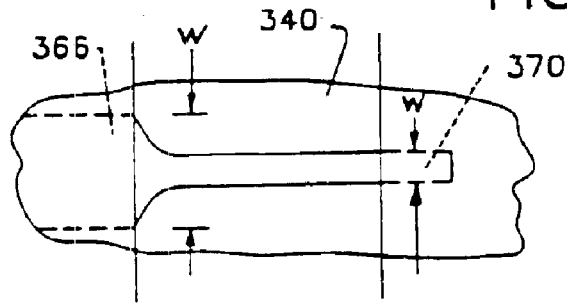
FIG. 12 is a fragmentary, plan view depicting the component of FIG. 10.

A connection component according to a further embodiment of the invention is illustrated in FIG. 10. That component 302 has a support structure incorporating only a single dielectric layer 332 having one or more gaps 340 therein. A lead 352 extends along the underside of layer 322. Lead 352 incorporates a connection section 356 extending across gap 340. A first end securement section 366 of lead 352 is electrically connected to a terminal 348 and is permanently bonded to layer 322. First end securement section 366 is disposed adjacent the first end of connection section 356. The second end 362 of connection section 356 is connected to a second end securement section 370 which, in turn, is releasably bonded to the underside of layer 322. Thus, the bond between first end securement section 366 and layer 322 is considerably stronger than the bond between second end securement section 370 and layer 322. Such differences in bond strength may be achieved in several ways. As illustrated in FIG. 12, at least that portion of first end securement section 366 adjacent gap 340 may have a width W greater than the width W of the second end securement section 370.

Figure 11:
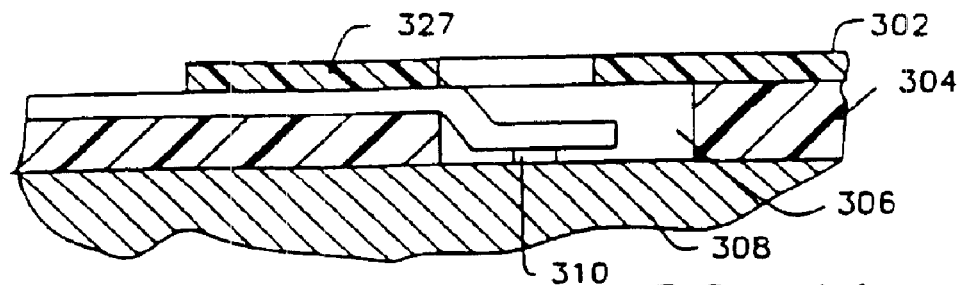
FIG. 11 is a fragmentary, sectional view depicting the component of FIG. 10 in conjunction with a semiconductor chip after an assembly process.
Figure 13:
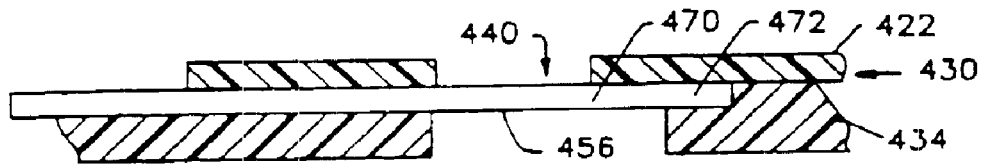
FIGS. 13 and 14 are fragmentary, sectional views similar to FIGS. 10 and 11 respectively but depicting a component in accordance with yet another embodiment of the invention.
Figure 14:
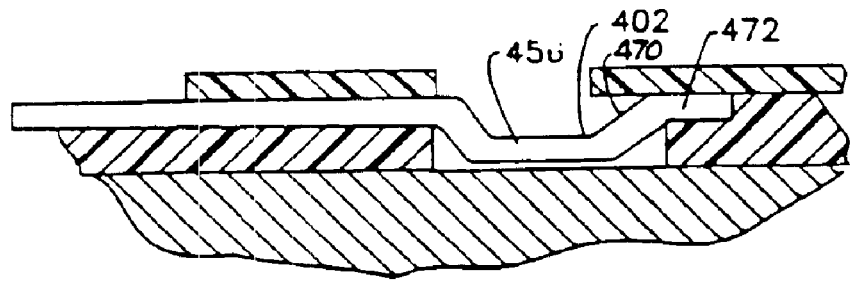

The connection components 302 of FIG. 10 is employed in conjunction with a separate underlayer 304. Underlayer 304 consists essentially of a layer of dielectric material having gaps 306. The gaps 306 in underlayer 304 are arranged in a pattern corresponding to the pattern of gaps 340 in the dielectric layer of the support structure in the connection component itself. In use, the underlayer 304 is applied on the front surface of the chip, and connection component 302 is applied on top of the layer 304. Thus, as seen in FIG. 11, when used with the separate bottom layer 304, the connection component 302, and hence the connection sections 356 of the leads are supported above the front surface of chip 308. Once again, while the component is being positioned, the connection sections 356 are supported at both sides of the gaps 340. In the bonding process, a bonding tool as discussed above is employed to force each connection section downwardly, into engagement with the contact 310 of the chip. In this operation, the second end securement section 370 is detached from the dielectric support structure layer 322 of component 302, whereas the first end securement section 366 and hence the first end of connection section 356 remains attached to such layer. Stated another way, the second end of each connection section 356 is released from its attachment with the support structure through peeling or breakage of the bond between the second end securement section and the support structure, rather than by breakage of a frangible section in the lead itself. In this arrangement, the lead does not incorporate a frangible section and hence there is no need for the supplemental layers discussed above with reference to FIG. 3. Desirably, the connection section of the lead consists essentially of a metal selected from the group consisting of copper, gold, nickel, silver, aluminum, platinum and combinations thereof, gold and gold alloys being particularly preferred. Essentially pure gold is especially preferred The component 402 illustrated in FIGS. 13 and 14 is generally similar to the component 302 described with reference to FIGS. 10–12. However, the support structure includes both a top layer 422 and a bottom layer 434 permanently connected together. Here again, a connection section of the lead extends across the gap 440 in the top layer of the support structure. The second end of section 456 is connected to a second end securement section 470, which section is releasably bonded to the top layer 422 of the support structure. However, the end of section 470 remote from connection section 456 is, in turn, attached to a further section 472 of the lead. That further section is permanently mounted to the support structure. As seen in FIG. 14, when connection section 456 is displaced downwardly, the second end 462 of the connection section, adjacent one side of the gap, is also displaced downwardly. The second end securement section 470 peels away from the top layer 422 to permit such downward displacement of the second end. In this embodiment, however, the second end 462 of the connection section remains loosely attached to the support structure through the second end securement section and the further section 472. This arrangement is generally less preferred than the other arrangements discussed above because the lead will be stretched somewhat during the assembly process, in deforming from the configuration of FIG. 13 to the configuration of FIG. 14. For this embodiment, it is particularly desirable to form the leads from gold, inasmuch as gold has excellent ductility to accommodate the stretching encountered in the assembly process.

Figure 15:
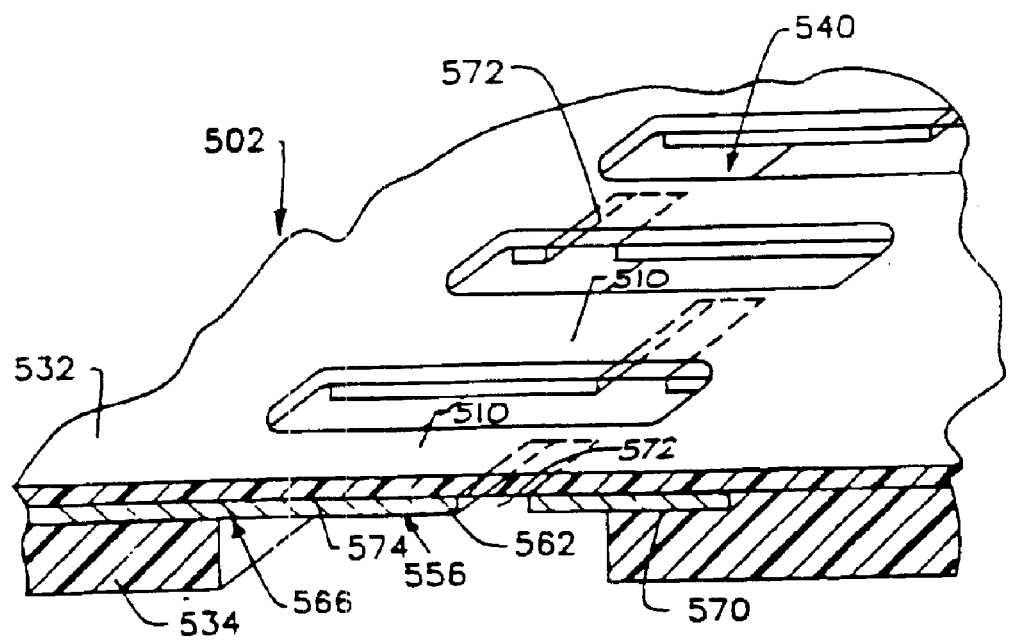
FIG. 15 is a view similar to FIG. 2 but depicting a component in accordance with a further embodiment of the invention.
Figure 16:
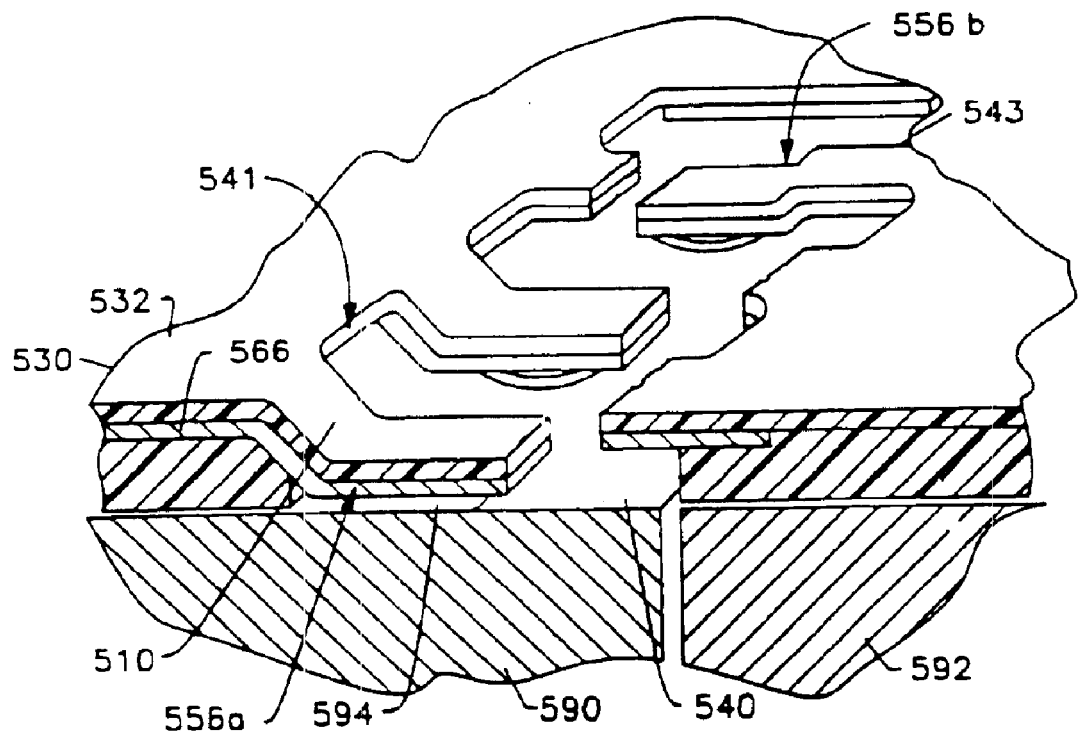
FIG. 16 is a fragmentary, partially sectional perspective view depicting the component of FIG. 15 and a chip after an assembly process.

The component 502 illustrated in FIGS. 15 and 16 has a bottom layer 534 and a top layer 532 similar to those discussed above, the top layer 532 being formed from a polymeric dielectric material, such as polyimide. Here, again, each lead includes a structural metal layer 574, a first supplemental layer 576 overlying the top surface of the structural metal layer 574 and a second supplemental metal layer 578 on the bottom surface of layer 574. This layered metallic structure extends throughout a first end securement section 566 overlying the supporting structure, and also throughout connection section 556 and second end securement section 570. Each lead further includes a polymeric strip 510 formed integrally with the top layer 532 of the support structure. The top surface of the metallic lead structure, i.e., the top surface of the first supplemental metal layer 576 and the underlying top surface of structural layer 574 are generally flat. Each polymeric strip 510 closely overlies the top surface of one such metallic structure and is bonded thereto, so that each such polymeric strip becomes, in effect, part of the underlying lead. As in the component discussed above with reference to FIGS. 1–3, the second end 562 of each connection section 556 is attached to the second end securement section 570 of the lead through a frangible section 572. Within each frangible section, the metallic structure is entirely omitted, so that the frangible section consists only of the polymeric strip 510. In a variant of this approach, the topmost or first supplemental layer 576 may be continued through the frangible section, so that the frangible section incorporates both polymeric strip and the relatively thin supplemental metal layer. In a further variant, one or both of the supplemental metal layers may be omitted. The structural metal layer 574 may be entirely omitted in the frangible section 572, or may be formed with a substantially reduced thickness and/or width in such section. The component of FIG. 15, like the component of FIGS. 1–3, has leads extending from both sides of the gap 540. Thus, some of the frangible sections 572 are disposed adjacent one side of the gap, whereas others are disposed adjacent the other side of the gap.

The component of FIG. 15 is assembled to a semiconductor chip 590 and ring 592 in substantially the same way as the component of FIGS. 1–3. As the connection sections 556 of the various leads are forced downwardly into engagement with the contacts 594 of the chip, the portions of the polymeric strips constituting the frangible sections 572 of the leads break, thereby detaching the second ends 562 of the connection sections 556 from the support structure. In the structure remaining after the leads have been bonded to the contacts (FIG. 16), each lead has a securement section 566 secured to a part of the support structure 530 and the connection section of each lead projects beyond an edge of the support structure. For example, the connection section 556*a* of one lead projects beyond an edge 541 of the securement structure 530 at one side of gap 540. The securement section 556*b* of another lead projects into gap 540 from the other side, and hence projects beyond edge 543 on the opposite side of the gap. The projecting connection section of each such lead is flexed downwardly at and adjacent to the associated edge. For example, the connection section 556*a* is flexed downwardly at edge 541. The polymeric strips 510 and the polymeric top layer 532 of the support structure, formed integrally therewith, serve to reinforce the downwardly flexed portions of the leads. In particular, the polymeric strips and polymeric top layer reinforce the metallic structures of the lead and protect it from stress concentrations.

Figure 17:
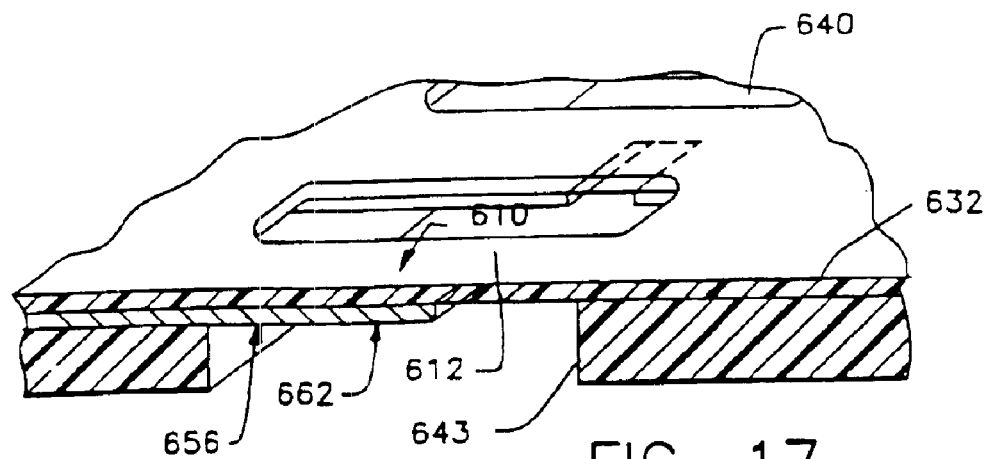
FIGS. 17, 18 and 19 are fragmentary, diagrammatic sectional views depicting additional components in accordance with further embodiments of the invention.

The embodiment illustrated in FIG. 17 is similar to that described above with reference to FIGS. 15 and 16. Here, again, polymeric strips 610 integral with the top layer 632 of the support structure extend across the gap 640. However, the leads do not have discrete second end securement sections. Rather, the metallic structure in the connection section 656 of each lead terminates at the second end 662 of such connection section remote from the edge 643 of gap 640. Each such second end is secured to the support structure through a portion 612 of the polymeric strip extending from such second end to the support structure. In operation, the portion 612 of the polymeric strip disposed between the second end of each connection section and the support structure breaks when the connection section of the lead is forced downwardly into engagement with the electrical contact of the chip. In other respects, this structure operates in substantially the same way as that described above with reference to FIGS. 15 and 16.

Figure 18:
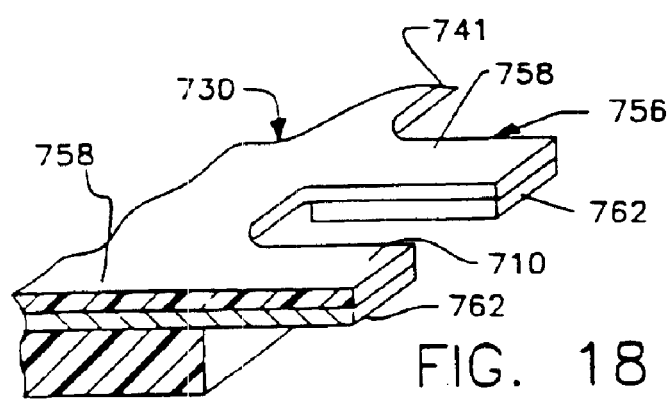

The component illustrated in FIG. 18 has connection sections 756 which are cantilevered. That is, these connection sections project beyond edge 741 of support structure 730, but the second ends 762 of such leads, remote from the edge 741 are not connected to the support structure. Stated another way, the projecting connection sections 756 of the leads are attached to the support structure only at their respective first ends 758. Accordingly, this structure does not provide the enhanced alignment action achieved with the other embodiments in which the second end of the lead is connected to the support structure. However, because each lead incorporates a polymeric strip 710 overlying and bonded to its metallic structure, these leads will have the reinforcement discussed above with reference to FIGS. 15, 16 and 17. That is, when the leads are flexed downwardly, the polymeric strips will reinforce the projecting portions of the metallic structure against stress concentration, particularly at and adjacent the edge of the support structure.

Figure 19:
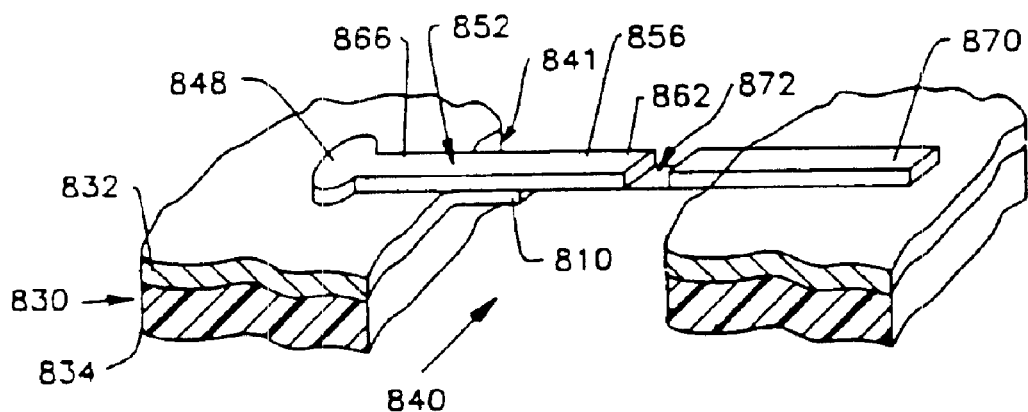

The component illustrated in FIG. 19 has the metallic structure of its leads 852, and its terminals 848, disposed on top of the polymeric top layer 832. Strips 810 formed integrally with the polymeric top layer 832 extend outwardly beyond edge 841 beneath the metallic structure of each lead. Thus, the metallic structure of each lead is reinforced at the juncture of connection section 856 and first end securement section 866, i.e., at and adjacent the point where the lead crosses the edge 841 of the support structure. Each polymeric strip 810, however, terminates short of the second end 862 of the connection section, so that a portion of the connection section 856 adjacent the second end 862 has an exposed, downwardly facing metallic surface for engagement with the contact (not shown) of the chip. When the component of FIG. 19 is engaged with a chip, the connection section 856 of each lead is flexed downwardly, breaking the frangible section 872 as discussed above. Here again, the polymeric reinforcing strip 810, closely overlying and bonded to the metallic structure of the lead, reinforces the lead against stress concentration, particularly at adjacent edge 841.

As will be readily appreciated, the features of the various embodiments discussed above can be combined with one another. For example, the various connection components illustrates and discussed above as including both a top layer and a bottom layer in their respective support structures can be formed without the bottom layer and used with a separate bottom layer similar to that discussed above with reference to FIGS. 10 and 11. Alternatively, the bottom layer can be omitted entirely.

A process for making a connection component incorporating a lead with a frangible section is illustrated in FIGS. 20A–20G. The process starts with a sheet of polyimide or other thin, flexible dielectric material 902. The sheet has holes 904 formed therein at locations where terminals are desired. A thin layer of copper is deposited non-selectively over the entire sheet, so as to form thin copper layers 906 and 908 on the top surface and bottom surface, respectively, of sheet 902, and also to deposit a thin layer of copper 910 extending through the holes 904. Using a conventional photoresist process, a heavy, structural layer of copper, typically about 0.01 mm to about 0.1 mm thick is applied selectively in holes 904 to form plated "barrel" structures 912 and is also applied selectively on bottom layer 908 so as to form elongated strips 914 on the bottom surface of the sheet where conductors are desired. Strips 914 merge with the copper layer 908 on the bottom surface of the sheet. A pattern of photoresist 907 is used in selectively forming strips 914. Resist pattern 907 incorporates a mass of resist 916 covering bottom copper layer 908 at a preselected point along the length of each strip 914. This resist mast 916 thus forms an interruption in each strip 914. However, the elements of strip 914 on opposite sides of this mass are interconnected by a thin web 917 of copper originally part of copper layer 908. A layer of a supplemental metal, in this case gold, is then selectively applied on the same areas as the copper, i.e., on the strips 914 and on barrels 912. In the next stage of the process (FIG. 20B), the photoresist material 907 used in the steps discussed above is removed, and a new photoresist material 920 is non-selectively applied over the entire bottom surface. The top surface of the sheet is then subjected to an etching process of limited duration. The limited etching process removes the thin copper layer 906 from top surface of the sheet, but it does not substantially attack the plated barrels 910.

Figure 20A:
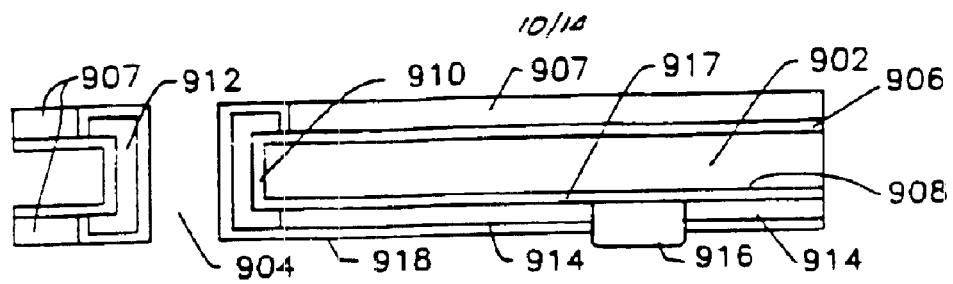
FIGS. 20A through 20G are diagrammatic sectional views depicting a fabrication process in accordance with an embodiment of the invention.
Figure 20B:
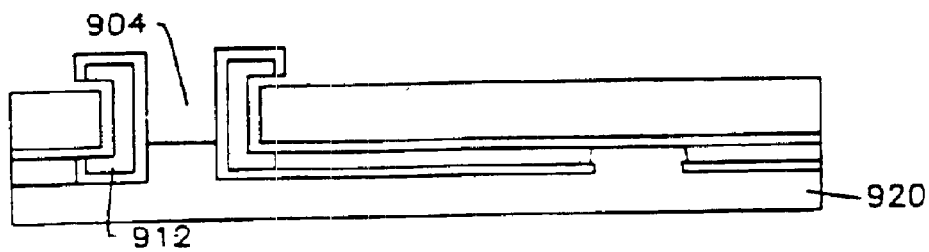
Figure 20C:
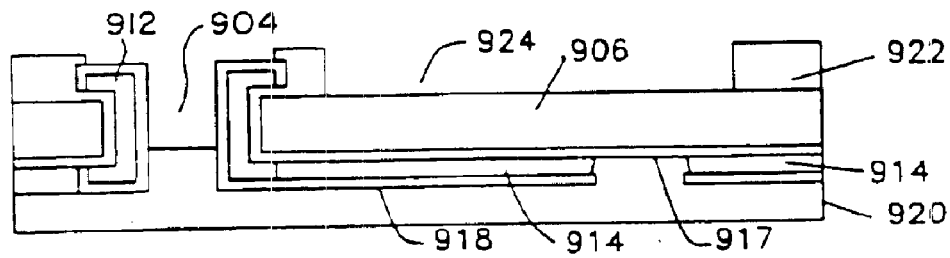
Figure 20D:
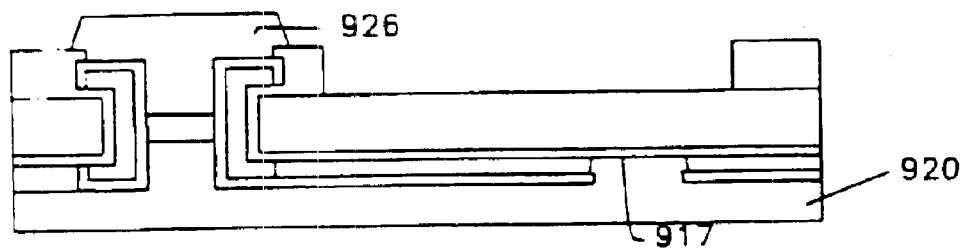

In the next stage of the process, a further photoresist 922 is applied to the top surface of the sheet. That photoresist has holes aligned with plated barrels 912, so that the plated barrels are left uncovered. Moreover, top photoresist 922 has spaces 924. Those spaces are aligned with the interruptions in strips 914, and hence with the thin webs 917 left in each strip. As seen in FIG. 20C, each such interruption and thin web 917 is disposed adjacent one side of space 924. In the next stage of the process (FIG. 20D), a mass of copper is deposited at the top of each plated barrel 912 so as to form a terminal 926. A layer of nickel (not shown) is also deposited over this copper mass.

Figure 20E:
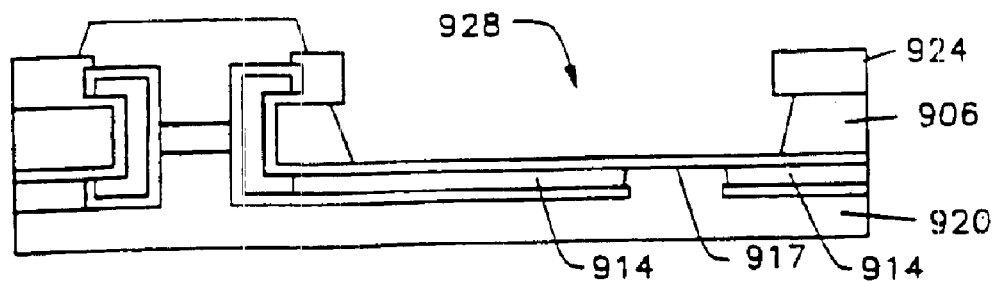

After the terminals 926 have been formed, the assembly is subjected to a polyimide etching step (FIG. 20E). Those areas of the polyimide underlying spaces 924 in the top resist 922 are removed by the etchant so as to form gaps 528 in polyimide layer 906. The gaps are aligned with the interruptions in strips 914, and hence aligned with the thin webs 917 bridging these interruptions, each such interruption and thin web being disposed adjacent one side of the gap. The polyimide etching process may be performed using well-known techniques as, for example, laser etching or plasma etching.

Figure 20F:
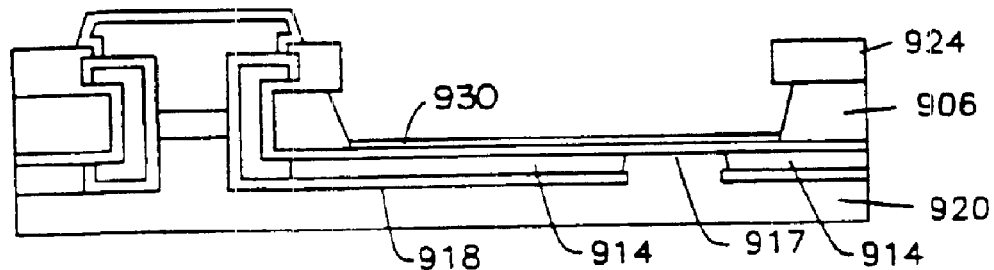
Figure 20G:
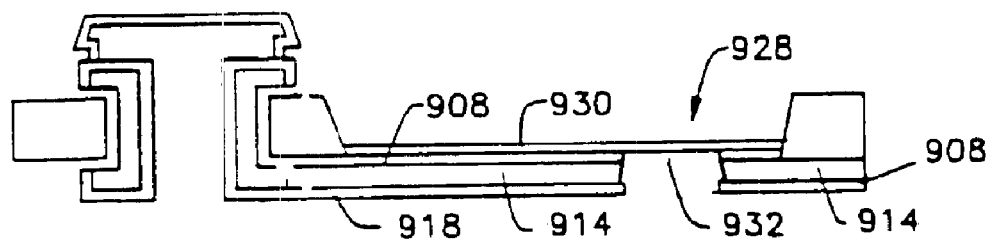

After the polyimide has been etched, and while the bottom resist layer is still in place, a thin layer 930 of a supplemental material, in this case gold, is applied on strips 914 by plating. Gold layer 930 also covers the thin copper webs 917 extending across the interruption in each strip 914 (FIG. 20F). Thus, gold layer 930 extends across each such interruption. Following deposition of layer 930, the bottom photoresist 920 is stripped from the assemblage, and the bottom surface of the assemblage is subjected to a sub-etching process similar to that discussed above. This sub-etching process is sufficient to remove all exposed portions of layer 908, but does not appreciably attack the gold-covered copper in strips 914. Because thin webs 917 are uncovered at this point, they are removed in the sub-etching process (FIG. 20G). This leaves a structure as discussed above with reference to FIG. 3. Thus, the copper structural material of the strips 914 is covered by the gold supplemental materials on its top and bottom surfaces, and the copper structural material is interrupted at a frangible section adjacent one edge of gap 928. Thus, portions of the copper lead on opposite sides of each such gap are connected to one another only by a thin web of the gold supplemental material 930.

In the foregoing process, the lead is supported at both ends while forming the frangible section and also while forming the dielectric supporting material to its final configuration, i.e., while forming the gap in the dielectric support layer. In this case, the lead is supported by the dielectric material itself, and the dielectric material is etched away to form the gap. However, a reverse process could also be employed, wherein the lead is supported at both ends by a photoresist or other temporary layer and the dielectric material is selectively deposited so as to form a structure having a gap aligned with the frangible section of the lead. Conversely, the gap in the dielectric support layer can be formed first, and the lead can be deposited and etched to form the frangible section. The materials used in the process can be varied, and may include the different structural and supplemental materials discussed above.

A process for making a connection component having a permanently secured first end securement section and a detachable second end securement section is schematically illustrated in FIGS. 21A through 21H. The process begins with a laminate including a substantially continuous dielectric support layer 1002 of polyimide or another suitable polymer and a thin layer 1004 of copper or other suitable conductive material on the bottom surface on the dielectric support layer 1002. Utilizing conventional masking and selective electroplating techniques, strips of gold or other suitable lead material 1006 are deposited on copper layer 1004 in a side-by-side array. Only one such strip is visible in FIG. 21B. After deposition of the gold strips 1006 and removal of any temporary masking material used for that process, a layer of photoresist 1008 is deposited on the gold strips and copper layer.

Figure 21A:
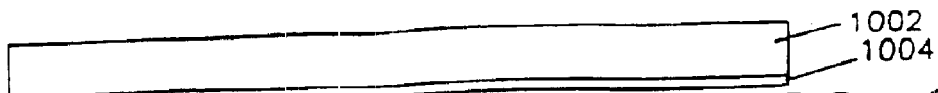
FIGS. 21A through 21H are diagrammatic sectional views similar to FIGS. 20A through 20G but depicting another fabrication process in accordance with another embodiment of the invention.
Figure 21B:
Figure 21C:
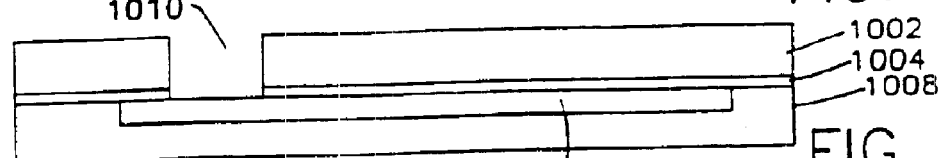
Figure 21D:
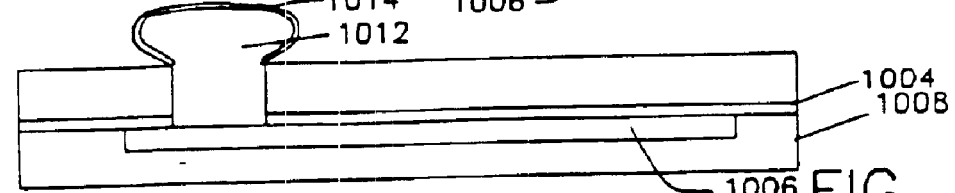

Openings 1010 (FIG. 21C) are etched through polyimide layer 1002 and, desirably, through copper layer 1004 as well. One such opening 1010 is provided for each gold strip 1006, so that the top surface of each gold strip is exposed in one such opening. A bump contact is formed within each such opening 1010. As seen in FIG. 21D, each such bump contact includes a mask 1012 of a base metal such as copper in electrical contact with the associated gold strip 1006 and an overlayer 1014 of a solderable, chemically resistant metal such as nickel, gold or alloys thereof. Following deposition of the bump contacts, photoresist layer 1008 is removed and the thin copper layer 1004 is also removed from the underside of polyimide layer 1002 except in the areas covered by gold strips 1006. This electrically isolates the individual gold strips 1006 from one another, leaving the assembly in the condition illustrated in FIG. 21E.

Figure 21E:
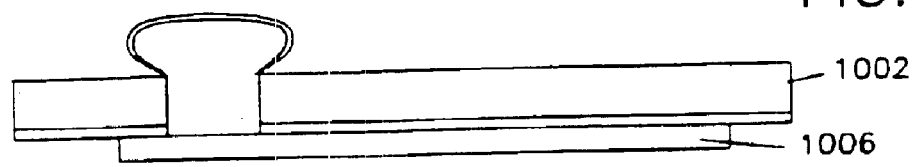
Figure 21F:
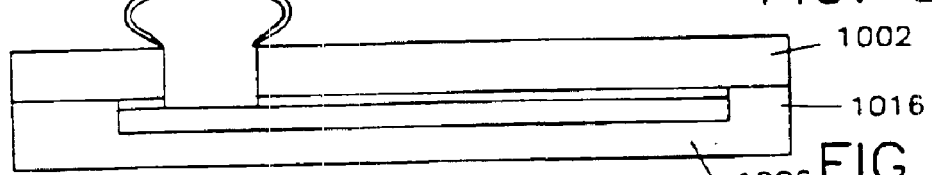
Figure 21G:
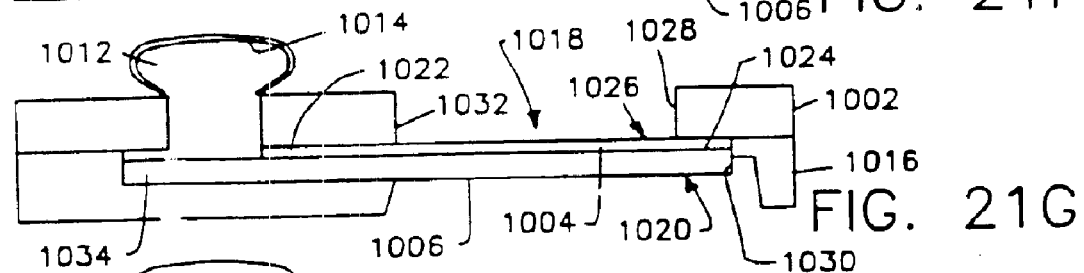
Figure 21H:
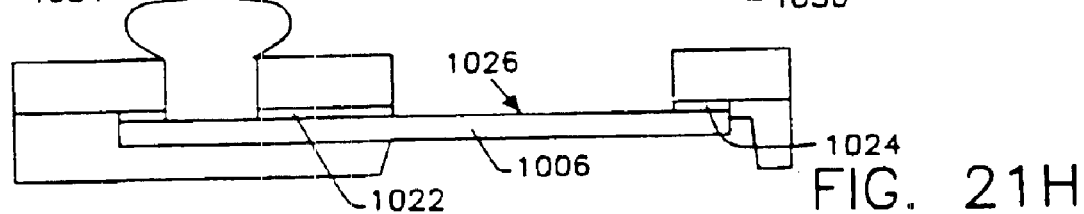

Next, a substantially continuous layer of a relatively soft, compliant solder mask material 1016 is applied on the bottom surface of polyimide layer 1002 and on strips 1006 (FIG. 21F). Using etching processes as discussed above in connection with FIGS. 20A through 20G, a gap 1018 is etched into polyimide support layer 1002 whereas a further gap 1020 is formed in underlayer 1016. As illustrated in FIG. 21E, the gap 1018 in support layer 1002 overlies a connection section or part 1026 of strip 1006 relatively close to one end of the strip. Thus, a relatively long first end securement section 1022 of each strip 1006 remains attached to support layer 1002 on one side of gap 1018 whereas a relatively short second end securement section 1024 remains attached to layer 1002 on the other side of gap 1018. As used with reference to portions of strip 1006, the terms "long" and "short" refer to the lengths of these portions in the direction of elongation of strip 1006, i.e., in the directions from left to right and right to left in FIG. 21G. Merely by way of example, the second end securement section 1024 may be about 0.025 mm to about 0.075 mm long, as measured from the adjacent edge 1028 of gap 1018 to the end 1030 of strip 1006 at the second end securement section. The first end securement section 1022 desirably is longer than the second end securement section. Thus, the first end securement section 1022 may be at least about 1.25 mm long, as measured from the adjacent edge 1032 of gap 1018 to the end 1034 of strip 1006 bounding the first end securement section 1022. The bump contact 1012 1014 is disposed on the first end securement section 1022.

The gap 1020 in underlayer 1016 is slightly larger than the gap 1018 in dielectric support layer 1002. Gap 1020 is partially aligned with gap 1018 so that gap 1020 encompasses the connection section 1026 of the strip and also encompasses the second end securement section 1024. Thus, the first end securement section 1022 remains engaged between underlayer 1016 and support layer 1002 whereas the second end securement section 1024 is exposed through gap 1000. In the next stage of the process (FIG. 21*h*) the residual portion of copper layer 1004 remaining on the strip 1006 is removed in the connection portion 1026 of the strip, leaving the lead with first end securement section 1022, connection section 1026 and second end securement section 1024. Because second end securement section 1024 is connected to the dielectric support layer 1002 over only a very short length, and hence a very small area, and because the second end securement section 1024 is unsupported by the underlayer 1016, the second end securement section can be detached readily from the support layer when the connection section 1026 is engaged by a bonding tool. Conversely, the first end securement section is securely bonded to the dielectric support layer 1002 over a substantial length, and is supported by the underlayer 1016, so that the first end securement section is substantially permanently connected to the dielectric support layer.

Figure 22:
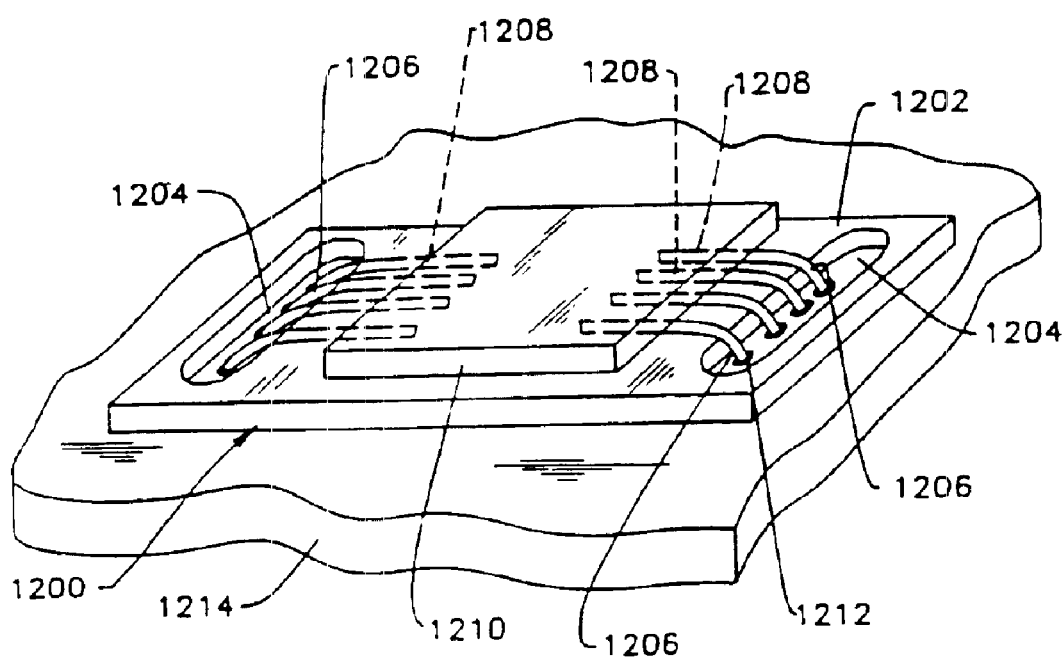
FIG. 22 is a diagrammatic perspective view illustrating an assembly incorporating a component according to yet another embodiment of the invention.

In all of the embodiments illustrated above, the connection sections of the leads are bonded to contacts on the chip. However, similar components and methods can be used for bonding to a substrate or to another component of a semiconductor chip assemblage. Such a variant is schematically shown in FIG. 22. The connection component 1200 has a dielectric supporting structure 1202 similar to those discussed above. The supporting structure 1202 defines gaps 1204. Numerous leads are provided, which only a few are shown in FIG. 22. Each lead has a connection section 1206 which, prior to assembly, extends across a gap 1204. Each lead also has a terminal 1208 remote from gap 1204. In the assembly procedure, the terminals 1208 are connected to terminals on a semiconductor chip 1210 whereas the connection sections 1206 of the leads are connected to contacts 1212 on a chip mount, hybrid circuit panel or other supporting substrate 1214. The configurations of the connection sections 1206 may be similar to any of those discussed above. Also, the bonding procedures used for bonding the connection sections to the contacts of the substrate may be essentially the same as those discussed above with reference to bonding to a chip. According to yet a further variant (not shown) the terminals 1208 may be replaced by a further set of connection sections and further gaps in the supporting structure. In this arrangement, each individual lead has two separate connection sections extending across two separate gaps in the supporting structure. The leads and gaps are configured so that when the connection component is disposed on an assemblage of a chip and substrate, one set of connection sections is positioned atop contacts on the chip, whereas another set of connection sections, and the associated gaps, are positioned atop contacts on the substrate. In this arrangement, the bonding procedures discussed above may be used both for bonding the leads to the chip and for bonding the leads to the substrate.

Figure 23:
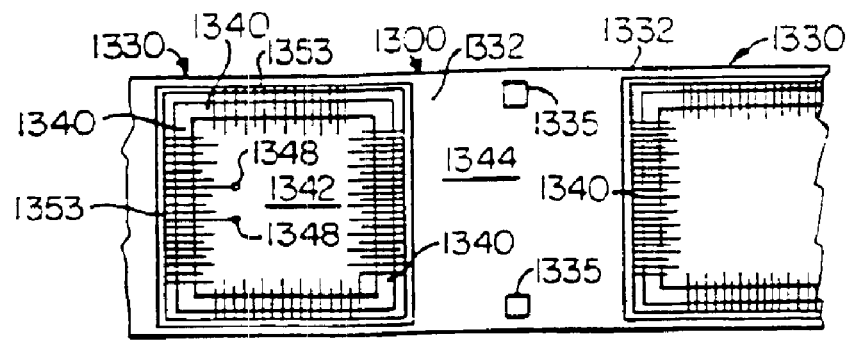
FIG. 23 is a diagrammatic view depicting a plurality of components in accordance with yet another embodiment of the invention.

A tape 1300 including a plurality of components in accordance with another embodiment of the invention is schematically depicted in FIG. 23. The tape includes a plurality of components each incorporating a support structure 1330. The support structure of each component incorporates a flexible, sheetlike dielectric layer 1332 as discussed above and may also include a soft, compliant layer similar to those discussed above, the compliant layer lying beneath the flexible dielectric layer 1332. The support structure of each component has gaps 1340 extending through it from its top surface to its bottom surface so as to subdivide the support structure into an interior or central portion 1342 and an outer or peripheral portion 1344. The gaps merge with one another so that the central or interior portion 1342 of each component is not connected to the outer or peripheral portion of the support structure by any other portion of the support structure. Rather, as discussed below, the central portion 1342 is temporarily connected to the outer or peripheral portion 1344 of the support structure by the leads extending across gaps 1340.

The support structures of numerous components are formed as parts of the same continuous tape 1300. The outer or peripheral portions 1344 of the support structures of the various components, and particularly the outer or peripheral portions of the top dielectric layers 1332 are formed as parts of the same continuous piece of flexible dielectric film incorporated in the tape. The tape may be provided with features, such as the sprocket holes 1335, to facilitate feeding and movement of the tape in production processes.

Figure 24:
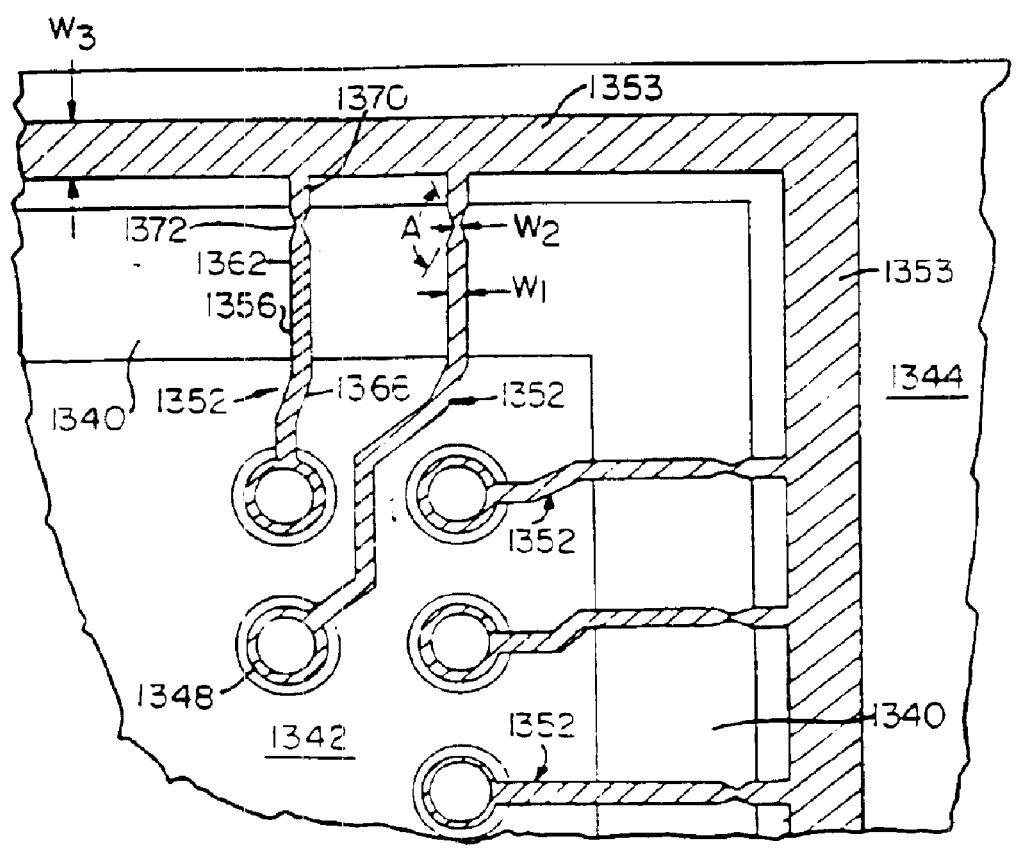
FIG. 24 is a diagrammatic plan of view on an enlarged scale depicting portions of one component illustrated in FIG. 23.

Each component in accordance with this embodiment has a plurality of elongated electrically conductive buses 1353 extending on the peripheral portion 1344 of the top dielectric layer alongside slots 1340 so that one such bus extends alongside of, and substantially codirectionally with, each such slot. The buses 1353 of each component form a generally rectilinear, hooplike structure encircling the gaps 1340 and the central portion 1342 of the support structure. Each component further has terminals 1348 disposed on the central portion 1342 of the support structure and a plurality of leads 1352 extending outwardly from the terminals. Each lead 1352 includes a first end securement section 1366 on central portion 1342; a connection section 1356 extending outwardly across one of the gaps or slots 1340 from the first end securement section; a frangible section 1372 joined to the second or outer end 1362 of the connection section and a second end securement section 1370 joining the frangible section to the bus 1353 lying alongside of the slot 1340. As shown in FIG. 24, the frangible sections 1372 lie just inside the outer margins of slots 1340. The connection sections of all of the leads associated with any given slot extend generally perpendicular to the slot and generally side-by-side parallel to one another. In the condition illustrated, the connection sections 1356 and frangible sections 1372 of the leads bridge gaps 1340 and physically connect the central portion 1342 of the support structure with the peripheral portion 1344. Moreover, in this condition all of the leads, and hence, all of the terminals, are electrically connected to one another.

The dimensions and configuration of the lead will vary somewhat depending upon the materials of construction and depending upon the desired application. Leads having connection sections and frangible sections formed principally or entirely from gold may be employed. For gold or other noble metal leads with relatively small spacing between leads, the width $w_1$ or dimension between the opposed edges of the lead in the direction transverse to the length of the connection section may be between about 15 microns and about 38 microns. The second end securement section 1370 may have a similar width. The frangible section 1372 of each lead may be defined by a pair of notches extending inwardly from the opposed edges of the lead. Each such notch may have a pair of angularly arranged edges defining a generally V-shaped notch with an included angle A (FIG. 24) desirably between about 45 degrees and about 120 degrees. The width $w_2$ of the frangible section in the notch, i.e., the smallest dimension of the neck or frangible section in the direction transverse to the length of the connection section may be between about 5 microns and about 12 microns. Most preferably, the leads, including the connection sections have a thickness or vertical extent perpendicular to the plane of the dielectric layer 1332 (perpendicular to the plane of the drawings in FIGS. 23 and 24) of about 10 to about 30 microns and most desirably about 25 microns. Preferably, each bus 1353 has a width $w_3$, i.e., the dimension transfers to the length of the bus, of at least about 50 microns and more preferably between about 50 and about 200 microns and a thickness of about 10 to about 30 microns and more preferably about 25 microns.

Components as illustrated in FIGS. 23 and 24 may be formed by processes similar to those discussed above. Preferably, the process starts with a laminate including flexible layer 1330 with a thin film of copper deposited on the top surface. A photoresist is deposited on the copper, exposed to illumination in a pattern corresponding to the negative pattern of the desired leads and then subjected to processes to develop the photoresist. The undeveloped photoresist is then removed and a layer of gold in the thickness desired for the leads and buses is then plated on the copper in the areas left uncovered. This photoresist is then removed and the part is subjected to an etching process which removes the copper layer in those areas not covered by the gold of the buses and leads. Using a further mask, terminals 1348 are built up by further electroplating. In this electroplating process, the buses 1353 and leads 1352 provide electrical connections to the terminals 1348. Then, slots or gaps 1340 are formed by chemical etching or by laser etching dielectric film 1330. Formation of the slots or gaps leaves the lower surfaces of connection sections 1356 and frangible sections 1372, with portions of the initial copper layer thereon exposed. The component is then subjected to a further etching procedure to remove the copper from the lower surfaces of these parts, so that the connection sections and frangible sections are essentially devoid of copper. Some copper, however, is left beneath the first end attachment section 1366 and second end attachment section 1370 of each lead, and beneath each bus 1353, serving to anchor those parts to layer 1330. The component may be provided with the compliant layer 1334 beneath layer 1330 either at this point in the manufacturing process or when the component is assembled to the semiconductor chip.

Figure 25:
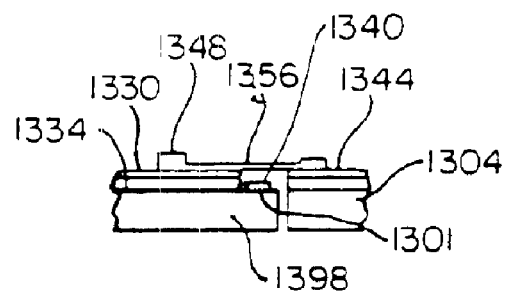
FIG. 25 is a fragmentary sectional view depicting a portion of the component of FIG. 24 together with other elements.

The component of FIGS. 23–25 may be employed with a semiconductor chip 1398 (FIG. 25) similar to those discussed above. Thus, the component is juxtaposed with the chip so that the central portion 1342 of the support structure overlies the central region of the chip, leaving slots 1340 and connection sections 1356 of the leads aligned with contacts 1301 on the chip. Compliant layer 1334 bears on the chip 1398. A support or ring 1304 encircling the chip may be provided to support the peripheral portion 1344 of the support structure. Leads 1356 are connected to contacts 1301 on the front face of the chip by a sequential bonding process similar to those discussed above. Thus, a bonding tool (not shown) is advanced downwardly into each slot 1340 so as to bond a lead to one contact, and the tool is then shifted sequentially along the slot with sequential bonding of various leads to the chip. During the bonding step, as the bonding tool engages each lead and forces it downwardly, the load applied to fracture the frangible section is distributed by the bus or a wide region of the support structure peripheral portion. This tends to maintain the second end securement section 1370 of each lead securely in position and thereby facilitates breakage of the frangible sections 1372. During the beginning part of this process, the central region 1340 of the support structure is held in place by the peripheral portion 1344 and by the leads connecting the central portion 1342 to the peripheral portion. Although each lead in and of itself is fragile, all of the leads together effectively secure the central portion in place. Buses 1353 substantially reinforce and stabilize the leads, and help to maintain the precise spacings between adjacent leads. As each lead is forced downwardly and bonded to the contact on the chip, its frangible section 1372 is broken thereby detaching the second end 1362 of its connection section 1356 from the bus, from the second end securement section 1370 of the lead and from the peripheral portion 1344 of the support structure. Thus, as the process continues the central portion is progressively detached from the peripheral portion and attached to the contacts of the chip. At each time during the process, however, the central portion is effectively held in place by the leads—first by the attachments of the leads to the peripheral portion, then by attachments of some leads to the peripheral portion and others to the chip and finally by attachment of the leads to the chip, leaving the central portion detached from the peripheral portion. After the bonding process, the peripheral portion may be processed to reclaim the gold present in the buses.

During the lead-bonding operation, it may be desirable to crumple each lead slightly by displacing the tool, and the section of the lead engaged therewith, towards the fixed or permanently connected end of the lead during the downward displacement and bonding steps, so as to form each lead into a generally S-shaped structure. This serves to limit or eliminate downward pull of the leads on the edge of the central or permanent portion of the connection component.

Also, the bonding tool may be provided with guide surfaces capable of engaging and aligning leads extending in either of two orthogonal directions. Thus, instead of the generally blade-like tool illustrated in FIGS. 5–8 hereof, the tool may have a generally square lower end. The tool body may likewise define two orthogonal first and second axes extending through a central or bonding region of the lower end in first and second horizontal directions. The guide surfaces may include a pair of first guide surfaces extending generally along the first axis, each such first guide surface flaring progressively outwardly, away from the first axis, with progressively increasing distance from the bonding region. Likewise, the body may further define a pair of second guide surfaces extending along the second axis and flaring progressively outwardly, away from the second axis, with increasing distance from the bonding region. The first and second guide surfaces may be generally in the form of partial surfaces of revolution about the first and second axes.

As these and other variations, combinations and modifications of the features discussed above can be employed without departing from the present invention, the foregoing description of the preferred embodiments should be taken by way of illustration rather than by way of limitation of the present invention as defined by the claims.

What is claimed is:

1. A semiconductor chip mounting component comprising:
   (a) a support structure adapted for engagement with a semiconductor chip having a top surface, a bottom surface, and a gap extending through said support structure between said surfaces and defining first and second portions of said support structure on opposite sides of the gap;
   (b) at least one elongated bus disposed alongside said gap, on said second portion of said support structure;
   (c) a plurality of electrically conductive leads, each said lead having a connection section extending across said gap, said connection section having a first end disposed on the first portion of the support structure, and a second end secured to said bus, and a frangible section disposed between the first and second ends of said connection section, said frangible section having a cross-sectional area that is smaller than a cross-sectional area of said connection section, said gap being open at said bottom surface of said support structure; and
   (d) a semiconductor chip disposed beneath said bottom surface of said support structure, wherein said leads are adapted to be bonded to contacts on said semiconductor chip disposed beneath said bottom surface by breaking the frangible sections of said leads so as to disconnect said second ends of said leads from the bus and engage the leads with the contacts of said semiconductor chip.

2. The component of claim 1, wherein the gap includes a plurality of holes.

3. The component of claim 2, wherein at least one of the leads extends across each of the holes.

4. The component of claim 1, wherein the gap includes at least one elongated slot and wherein each of the leads extends across one of the elongated slots.

5. The component of claim 4, wherein at least one of said elongated buses is disposed alongside each of said elongated slots.

6. The component of claim 1, wherein the frangible sections of at least some of the leads are disposed adjacent the second ends of said leads.

7. The component of claim 1, further comprising a polymeric reinforcement in contact with each said lead.

8. The component of claim 1, wherein the bus is comprised of a metallic material.

9. The component of claim 1, wherein the support structure includes a dielectric layer, said dielectric layer including first and second portions, said first portion of said support structure including said first portion of said dielectric layer, said second portion of said support structure including said second portion of said dielectric layer.

10. The component of claim 9, wherein the dielectric layer is flexible.

11. The component of claim 9, wherein the support structure further includes a compliant layer.

12. The component of claim 10, wherein the support structure includes a dielectric layer defining said top surface of said support structure and said compliant layer defining said bottom surface of said support structure.

13. The component of claim 12, wherein the leads are disposed on the dielectric layer.

14. The component of claim 1, wherein the connection section and the frangible section of each lead are formed integrally with one another and with the associated bus, the connection section of each lead defining a pair of opposed horizontal edges, and the frangible lead section of each lead having a pair of notches extending horizontally inwardly from said opposed edges to define a neck having a width less than the width between said edges.

15. The component of claim 14, wherein each said lead has a second end securement section extending between the frangible section and the associated bus.

16. A component as claimed in claim 1, wherein said gap includes a plurality of elongated slots extending substantially around said first portion so that the slots are disposed between the first portion and the second portion, the component including a plurality of said elongated buses arranged on said second portion so that one such bus extends alongside each said slot.

17. The component as claimed in claim 16, wherein said buses are connected to one another so that said buses cooperatively form a structure on said second portion substantially surrounding said first portion and said slots.

18. The component as claimed in claim 17, wherein said slots are connected to one another to form a substantially continuous channel surrounding said first portion, said first portion being connected to said second portion only through said leads, whereby said first portion will be detached from said second portion upon breakage of said frangible sections.

19. The component of claim 1, wherein said first and second portions of said support structure comprise a unitary support.

20. The component of claim 19, wherein said unitary support comprises a layer of dielectric material.

21. The component of claim 1, wherein said frangible section is mechanically weaker than said first and second ends of said connection section, whereby said frangible section is disconnectable from one of said first and second ends upon application of a force to said connection section.

22. The component of claim 21, wherein said frangible section is disposed overlying said gap between said first and second ends.

23. The component of claim 1, wherein said frangible section is disposed overlying said gap between said first and second ends.

24. The component of claim 1, wherein said frangible sections overlie said gap, at least one of said first and second ends of each said connection section is displaceable within said gap relative to said support structure upon severing said frangible section while leaving a remainder of said connection section intact.

25. The component of claim 1 further comprising terminals disposed on said first portion of support structure, at least some of said leads having their first ends connected to said terminals.

26. A semiconductor chip mounting component comprising:
   (a) a support structure adapted for engagement with a semiconductor chip having a top surface, a bottom surface, and a gap extending through said support structure between said surfaces and defining first and second portions of said support structure on opposite sides of said gap;
   (b) a plurality of electrically conductive leads, each said lead having a connection section extending across said gap, said connection section having a first end disposed on the first portion of the support structure, a second end secured to said bus, and a frangible section disposed between the first and second ends of said connection section, said frangible section having a cross-sectional area that is smaller than a cross-sectional area of said connection section so that said frangible section is mechanically weaker than said first and second ends of said connection section, wherein said frangible section is disconnectable from one side of said first and second ends upon application of a force to said connection section;

(c) a semiconductor chip disposed beneath said bottom surface of said support structure;

(d) said gap being open at said bottom surface of said support structure, said leads being adapted to be bonded to contacts on said semiconductor chip disposed beneath said bottom surface by breaking the frangible section of said leads so as to disconnect said leads from said bus and engage said leads with the contacts of the chips; and (e) terminals disposed on said first portion of said support structure, wherein at least some of said leads have their first ends connected to said terminals.

* * * * *